United States Patent
Nagashima et al.

(10) Patent No.: US 9,620,515 B2
(45) Date of Patent: Apr. 11, 2017

(54) SEMICONDUCTOR MEMORY DEVICE

(71) Applicant: Kabushiki Kaisha Toshiba, Minato-ku (JP)

(72) Inventors: Satoshi Nagashima, Yokkaichi (JP); Tatsuya Kato, Yokkaichi (JP); Keisuke Kikutani, Yokkaichi (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/819,706

(22) Filed: Aug. 6, 2015

(65) Prior Publication Data

US 2016/0336336 A1 Nov. 17, 2016

Related U.S. Application Data

(60) Provisional application No. 62/160,765, filed on May 13, 2015.

(51) Int. Cl.
*H01L 21/28* (2006.01)
*H01L 27/11556* (2017.01)

(52) U.S. Cl.
CPC .............................. *H01L 27/11556* (2013.01)

(58) Field of Classification Search
CPC ............... H01L 21/28; H01L 21/28282; H01L 27/11556; H01L 29/17883; H01L 21/31111; H01L 29/78642; H01L 21/823487; H01L 29/8725
See application file for complete search history.

(56) References Cited

U.S. PATENT DOCUMENTS

| 7,906,818 B2 | 3/2011 | Pekny |
| 8,237,213 B2 | 8/2012 | Liu |
| 2014/0126290 A1* | 5/2014 | Sakui .................. H01L 29/7889 365/185.05 |

(Continued)

FOREIGN PATENT DOCUMENTS

| JP | 2012-94694 | 5/2012 |
| WO | WO 2016/135849 A1 | 9/2016 |

(Continued)

OTHER PUBLICATIONS

U.S. Appl. No. 14/645,708, filed Mar. 12, 2015, Wataru Sakamoto et al.

*Primary Examiner* — Phuc Dang
(74) *Attorney, Agent, or Firm* — Oblon, McClelland, Maier & Neustadt, L.L.P.

(57) ABSTRACT

According to one embodiment, a semiconductor memory device includes a semiconductor pillar extending in a first direction in a first region. The semiconductor memory device also includes a first electrode film provided on a side of the semiconductor pillar and extending in a second direction different from the first direction in the first region and in a second region adjacent to the first region in the second direction. The semiconductor memory device also includes a second electrode film provided between the semiconductor pillar and the first electrode film in the first region. Film thickness in the first direction of the first electrode film in the first region is smaller than film thickness in the first direction of the first electrode film in the second region.

12 Claims, 27 Drawing Sheets

(56) References Cited

U.S. PATENT DOCUMENTS

2015/0041879 A1* 2/2015 Jayanti .............. H01L 21/28282
   257/324
2015/0200199 A1  7/2015 Sakamoto et al.
2016/0093626 A1* 3/2016 Izumi ................ H01L 21/7688
   257/324
2016/0172368 A1* 6/2016 Pang ................. H01L 27/11556
   257/314

FOREIGN PATENT DOCUMENTS

| WO | WO 2016/139727 A1 | 9/2016 |
| WO | WO 2016/178263 A1 | 11/2016 |

* cited by examiner

SEMICONDUCTOR MEMORY DEVICE

CROSS-REFERENCE TO RELATED APPLICATIONS

This application is based upon and claims the benefit of priority from U.S. Provisional Patent Application 62/160,765, filed on May 13, 2015; the entire contents of which are incorporated herein by reference.

FIELD

Embodiments described herein relate generally to a semiconductor memory device and a method for manufacturing the same.

BACKGROUND

There has been proposed a semiconductor memory device of a stacked type including a stacked body obtained by alternately stacking insulating films and word lines and semiconductor pillars that pierce through the stacked body. In the semiconductor memory device of the stacked type, memory cells are formed for each of portions where the semiconductor pillars and the word lines cross. It is desired to reduce interconnect resistance of the word lines in the semiconductor device of the stacked type.

BRIEF DESCRIPTION OF THE DRAWINGS

FIG. 7 is equivalent to a sectional view taken along line B-B' shown in FIG. 1;

FIGS. 10, 11 and 13 are equivalent to a region F shown in FIG. 9;

FIG. 14B is equivalent to a sectional view taken along line G-G' shown in FIG. 14A;

FIG. 15B is equivalent to a sectional view taken along line G-G' shown in FIG. 15A;

FIG. 16A is equivalent to a plan view taken along line H-H' shown in FIG. 15A;

FIG. 16B is equivalent to a plan view taken along line I-I' shown in FIG. 15A;

FIG. 17 is equivalent to a plan view taken along line I-I' shown in FIG. 15A;

FIG. 18 is equivalent to a plan view taken along line I-I' shown in FIG. 15A;

FIG. 19B is equivalent to a sectional view taken along line G-G' shown in FIG. 19A;

FIG. 20B is equivalent to a region 3 shown in FIG. 4;

FIG. 21A is equivalent to a region F shown in FIG. 9;

FIG. 21B is equivalent to a region 3 shown in FIG. 4;

FIG. 22A is equivalent to a region F shown in FIG. 9;

FIG. 22B is equivalent to a region J shown in FIG. 4;

FIG. 23A is equivalent to a region F shown in FIG. 9;

FIG. 23B is equivalent to a region J shown in FIG. 4;

FIG. 24A is equivalent to a region F shown in FIG. 9;

FIG. 24B is equivalent to a region K shown in FIG. 4;

FIG. 25 is equivalent to a region J shown in FIG. 4;

FIG. 26 is equivalent to a region 3 shown in FIG. 4;

FIG. 27 is equivalent to a region F shown in FIG. 9; FIG. 28 is equivalent to a region 3 shown in FIG. 4.

DETAILED DESCRIPTION

Figure 1:
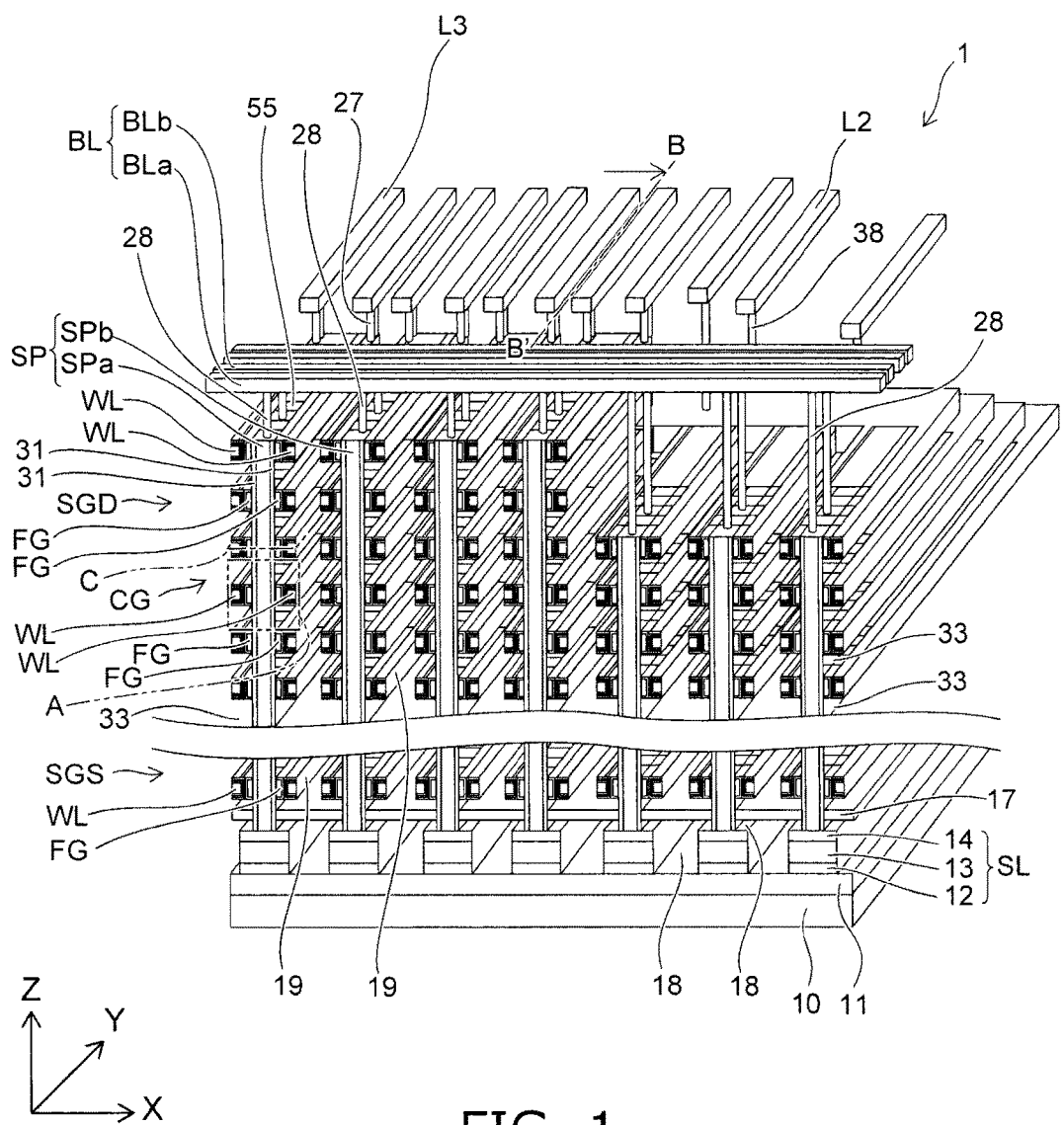
FIG. 1 is a perspective view illustrating the semiconductor memory device according to the embodiment.

According to one embodiment, a semiconductor memory device includes a semiconductor pillar extending in a first direction in a first region. The semiconductor memory device also includes a first electrode film provided on a side of the semiconductor pillar and extending in a second direction different from the first direction in the first region and in a second region adjacent to the first region in the second direction. The semiconductor memory device also includes a second electrode film provided between the semiconductor pillar and the first electrode film in the first region. The semiconductor memory device also includes a first insulating film provided between the semiconductor pillar and the second electrode film. The semiconductor memory device also includes a second insulating film provided between the second electrode film and the first electrode film. The semiconductor memory device also includes a third insulating film provided between the second insulating film and the first electrode film. The semiconductor memory device also includes a fourth insulating film provided between the third insulating film and the first electrode film. The semiconductor memory device also includes a contact provided in the second region and connected to the first electrode film. Film thickness in the first direction of the first electrode film in the first region is smaller than film thickness in the first direction of the first electrode film in the second region.

According to one embodiment, a method for manufacturing a semiconductor memory device includes forming a structure. The forming the structure includes alternately stacking a first insulating film and a filling film in a first direction to form a stacked body. The forming the structure also includes forming a groove-like first trench piercing through the stacked body in the first direction and extending along a second direction different from the first direction. The forming the structure also includes removing a part on the first trench side of the filling film to form a first hollow via the first trench, forming a second insulating film on an inner surface of the first hollow, filling the first hollow to form a first electrode film, forming a third insulating film on a surface of the first electrode film, filling the first trench with a semiconductor material to form a semiconductor body. The forming the structure also includes dividing, in a first region, the semiconductor body in the second direction to form a plurality of semiconductor pillars and dividing, for each of the semiconductor pillars, the third insulating film, the first electrode film, and the second insulating film in the second direction. The forming the structure also includes forming, on a side of the first trench, a groove-like second trench expanding along the first direction and the second direction. The forming the structure also includes removing the filling film to form a second hollow and expose a surface of the second insulating film via the second trench. The forming the structure also includes forming a fourth insulating film on a side surface of the second trench and an inner surface of the second hollow and forming a fifth insulating film on a surface of the fourth insulating film. The method for manufacturing a semiconductor memory device also includes forming a cover film on a surface of the structure, forming a mask on a surface of the cover film in the first region of the structure, removing the cover film in a second region adjacent to the first region in the second direction of the structure to expose the fifth insulating film, removing the fifth insulating film in the second region to expose the forth insulating film, removing the mask, removing the cover film. The method for manufacturing a semiconductor memory device also includes forming a second electrode film on a surface of the fifth insulating film in the first region and a surface of the fourth insulating film in the second region.

Hereinafter, with reference to the drawings, embodiments of the invention will be described.

EMBODIMENT

The configuration of a semiconductor memory device according to an embodiment is described.

FIG. 1 is a perspective view illustrating the semiconductor memory device according to the embodiment.

As shown in FIG. 1, in a semiconductor memory device 1 according to the embodiment, a silicon substrate 10 is provided. An insulating film 11 is provided on the silicon substrate 10.

In the following description, in the specification, an XYZ orthogonal coordinate system is adopted for convenience of description. That is, two directions parallel to a contact surface of the silicon substrate 10 and the insulating film 11 and orthogonal to each other are represented as an "X-direction" and a "Y-direction". A direction perpendicular to the contact surface of the silicon substrate 10 and the insulating film 11 and on a side where the insulating film 11 is disposed is represented as a "Z-direction".

On the insulating film 11, source lines SL mutually distal in the Y-direction and the X-direction are provided. The source lines SL are formed by conductive layers 12, interconnect layers 13 provided on the conductive layers 12, and conductive layers 14 provided on the interconnect layers 13. An insulating film 17 is provided on the source lines SL. Insulating members 18 are provided among the source lines SL and between the source lines SL and the insulating film 17.

On the source lines SL, silicon pillars SP extending in the Z-direction and mutually distal in the Y-direction are provided. The silicon pillars SP are formed of, for example, amorphous silicon (a-Si). The lower ends of the silicon pillars SP are connected to the source lines SL piercing through the insulating film 17. The silicon pillars SP are arrayed in a matrix shape along the X-direction and the Y-direction when viewed from the Z-direction. Tunnel insulating films 31 are provided on side surfaces in the X-direction and side surfaces opposite to the X-direction of the silicon pillars SP.

On side surfaces of the tunnel insulating films 31 on which the silicon pillars SP are not provided, a plurality of electrode films are provided mutually distal along the Z-direction. The electrode films are referred to as floating gate electrodes FG. On side surfaces of the floating gate electrodes FG on which the silicon pillars SP are not provided, word lines WL extending in the Y-direction are provided via insulating films. Insulating members 55 are provided and the word lines WL and the floating gate electrodes FG are not provided between two silicon pillars SP arrayed along the Y-direction. Therefore, the floating gate electrodes FG provided on the opposite side of the X-direction of the silicon pillars SP and the floating gate electrodes FG provided in the X-direction of the silicon pillars SP are not connected.

A plurality of word lines WL disposed closest to the source lines SL and in positions in the Z-direction equal to one another extend in the Y-direction. These word lines WL are referred to as source-side selection gate electrodes SGS. Contacts 37 (not shown in the figure) are provided on end portions in the Y-direction of the source-side selection gate electrodes SGS. Interconnects L1 (not shown in the figure) extending in the Y-direction are provided on the contacts 37. The interconnects L1 are connected to the source-side selection gate electrodes SGS via the contacts 37.

A plurality of word lines WL disposed on the source-side selection gate electrodes SGS via the insulating films 33 and in positions in the Z-direction equal to one another extend in the Y-direction. The word lines WL are bound as one word line WL at an extending destination. The one bound word line WL is referred to as control gate electrode CG. Contacts 38 are provided on end portions in the Y-direction of control gate electrodes CG. A plurality of interconnects L2 extending in the Y-direction and separated the X-direction are provided on the contacts 38. The interconnects L2 are connected to the control gate electrodes CG via the contacts 38.

A plurality of word lines WL disposed further in the Z-direction than the control gate electrodes CG and in positions in the Z-direction equal to one another extend in the Y-direction. These word lines WL are referred to as drain-side selection gate electrodes SGD. Contacts 27 are provided on end portions in the Y-direction of the drain-side selection gate electrodes SGD. A plurality of interconnects L3 extending in the Y-direction and separated in the X-direction are provided on the contacts 27. The interconnects L3 are connected to drain-side selection gate electrode SGD via the contacts 27.

Contacts 28 extending in the Z-direction are provided on the silicon pillars SP. A plurality of bit lines BL extending in the X-direction and separated in the Y-direction are provided on the contacts 28. Among a plurality of silicon pillars SP arrayed along the X-direction, when the silicon pillar SP provided on the opposite direction side of the X-direction most is represented as a first silicon pillar SP, odd number-th pillars SPa are connected to a common bit line BLa via the contacts 28. Even number-th silicon pillars SPb are connected to a common bit line BLb different from the bit line BLa via the contacts 28. Among the plurality of silicon pillars SP arrayed along the X-direction, silicon pillars SPa and SPb adjacent to each other are not connected to a common bit line.

Figure 2:
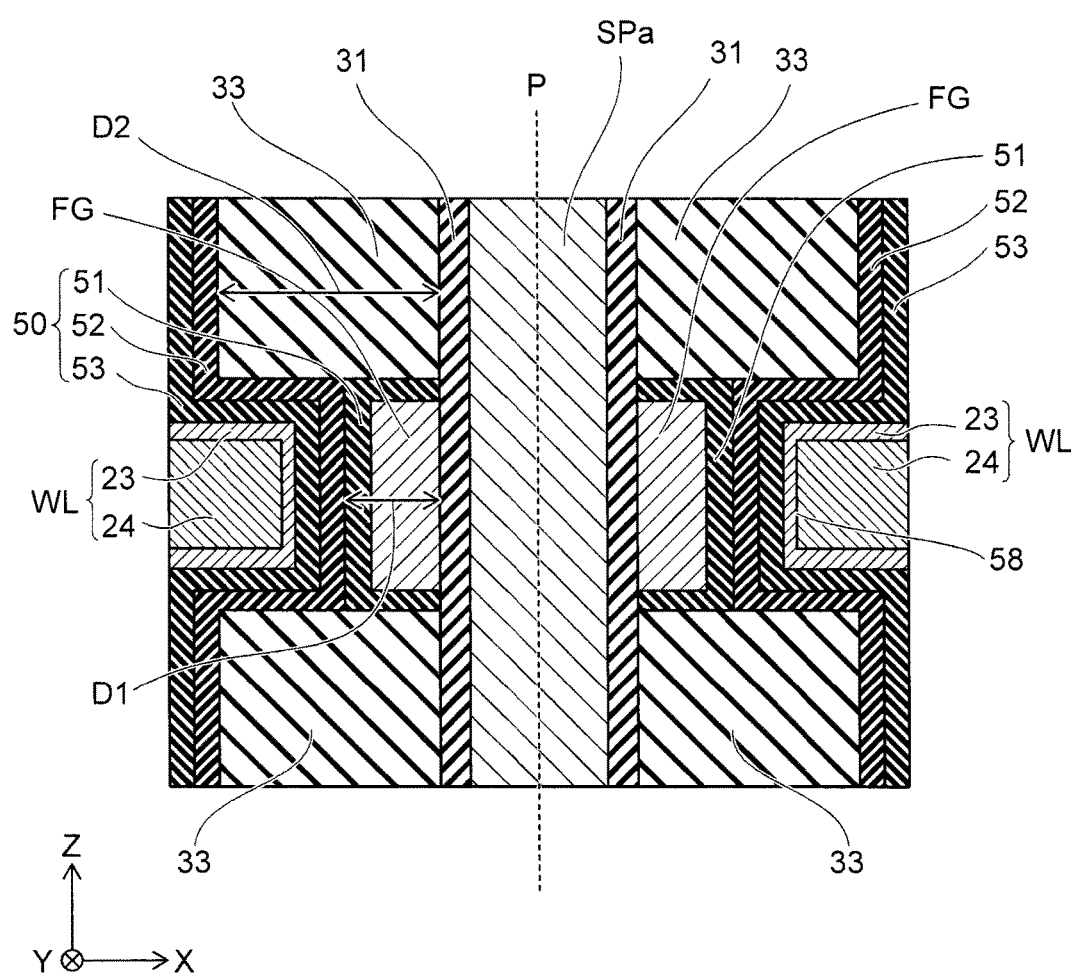
FIG. 2 is a sectional view illustrating a region A shown in FIG. 1.

FIG. 2 is a sectional view illustrating a region A shown in FIG. 1.

As shown in FIG. 2, the floating gate electrode FG and the insulating films 33 are alternately provided along the Z-direction on side surfaces of the tunnel insulating films 31 on which the silicon pillars SPa are not provided. Block insulating films 51 are provided on side surfaces on sides in the floating gate electrode FG where the silicon pillars SPa are not provided, on the upper surfaces of the floating gate electrode FG, and on the lower surfaces of the floating gate electrode FG. Block insulating films 52 are provided on side surfaces of the block insulating films 51 where the silicon pillars SPa are not provided and on surfaces of the insulating films 33 where the silicon pillars SPa are not provided.

Length D1 in the X-direction of the floating gate electrode FG and the block insulating films 51 is smaller than length D2 in the X-direction of the insulating films 33. Therefore, portions of the block insulating films 52 in contact with the block insulating films 51 are further on sides where the silicon pillars SPa are provided than portions of the block insulating films 52 in contact with the insulating films 33. Block insulating films 53 are provided on surfaces on sides of the block insulating films 52 where the silicon pillars SPa are not provided.

A barrier metal film 23 is provided between two insulating films 33 and on a surface on a side of the block insulating films 53 where the silicon pillar SPa is not provided. A conductive member 24 is provided on a surface on a side of the barrier metal film 23 where the silicon pillar SPa is not provided. The word line WL is formed by the barrier metal film 23 and the conductive member 24.

Stacked films formed by the block insulating films 51, the block insulating films 52, and the block insulating films 53 are referred to as block insulating films 50. The block insulating films 50 are films that substantially do not allow an electric current to flow even if a voltage is applied within a range of a driving voltage of the semiconductor memory device 1. The floating gate electrodes FG are films capable of accumulating electric charges. The tunnel insulating films 31 are films that are usually insulative but allow a tunnel current to flow when a predetermined voltage within the range of the driving voltage of the semiconductor memory device 1 is applied. The barrier metal films 23 are films that prevent diffusion of a material of the conductive members 24.

Figure 3:
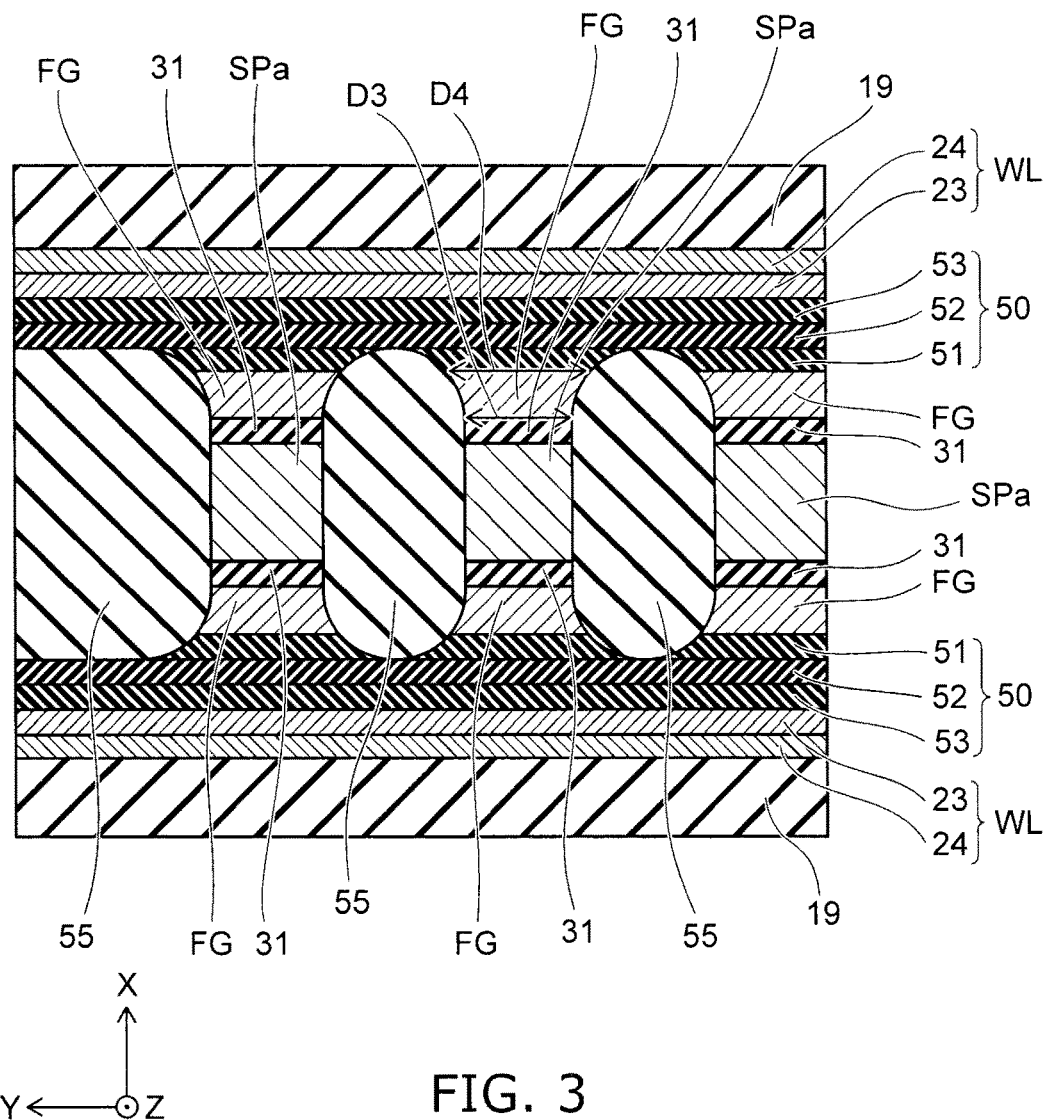
FIG. 3 is a plan view illustrating a region C shown in FIG. 1.

FIG. 3 is a plan view illustrating a region C shown in FIG. 1.

As shown in FIG. 3, when viewed from the Z-direction, the shape of the silicon pillars SPa is substantially square. The insulating members 55 are provided between two silicon pillars SPa arrayed along the Y-direction. The tunnel insulating films 31 and the floating gate electrodes FG are provided between the silicon pillars SPa and the word lines WL and are divided along the Y-direction by the insulating members 55. The tunnel insulating films 31 and the floating gate electrodes FG are provided for each of intersection points of the silicon pillars SPa and the word lines WL. Therefore, tunnel insulating films 31 and the floating gate electrodes FG are arrayed in a matrix shape mutually distal along the Y-direction and the Z-direction. When viewed from the Z-direction, the shape of the floating gate electrodes FG is a fan shape expanding on the word line WL sides. Therefore, length D3 in the Y-direction of end portions on the silicon pillars Spa sides in the floating gate electrodes FG is smaller than length D4 in the Y-direction of end portions on the word lines WL sides in the floating gate electrodes FG.

Figure 4:
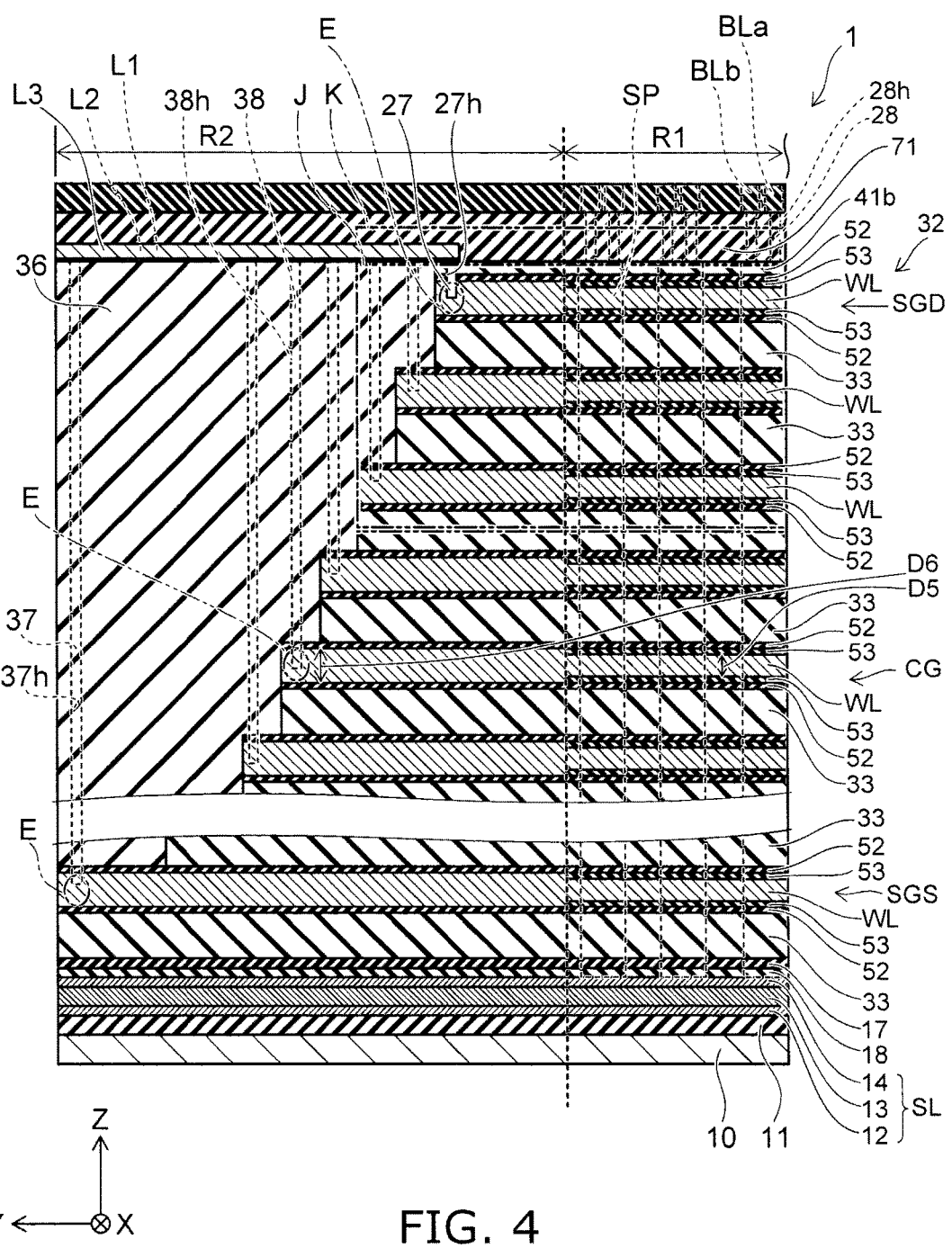
FIG. 4 is a sectional view taken along B-B' shown in FIG. 1.

FIG. 4 is a sectional view taken along B-B' shown in FIG. 1.

As shown in FIG. 4, on the source lines SL, a stacked body 32 obtained by alternately stacking the word lines WL and the insulating films 33 is provided. Y-direction end portions E of the stacked body 32 are processed in a step shape. The drain-side selection gate electrodes SGD are connected to the interconnects L3 via the contacts 27 provided on the end portions E. The control gate electrodes CG are connected to the interconnects L2 via the contacts 38 provided on the end portions E. The source-side selection gate electrodes SGS are connected to the interconnects L1 via the contacts 37 provided on the end portions E.

A region including the silicon pillars SP, the contacts 28, and the bit lines BL is referred to as memory cell region R1. A region further on the Y-direction than the silicon pillars SP and including the Y-direction end portions E of the word lines WL, the contacts 38, and the interconnects L2 is referred to as contact region R2.

In the semiconductor memory device 1 according to the embodiment, in the contact region R2, the block insulating films 52 are provided in contact with the word lines WL and the block insulating films 53 are not provided. On the other hand, in the memory cell region R1, the block insulating films 53 are provided between the word lines W and the block insulating films 52. Therefore, film thickness D5 in the Z-direction of the word lines WL in the memory cell region R1 is smaller than film thickness D6 in the Z-direction of the word lines WL in the contact region R2.

The silicon substrate 10 is formed of, for example, a semiconductor material containing silicon (Si). The insulating members 18 and insulating members 19 are formed of, for example, silicon oxide ($SiO_2$). The interconnects L1, the interconnects L2, the interconnects L3, and the bit lines BL are formed of, for example, tungsten (W). The tunnel insulating films 31 are formed of, for example, silicon oxide. The block insulating films 51 are formed of, for example, High-k materials such as silicon nitride (SiN) and hafnium oxide (HfO). The block insulating films 51 may be formed of materials containing metal such as ruthenium (Ru), aluminum (Al), titanium (Ti), zirconium (Zr), and silicon (Si). The block insulating films 52 are formed of, for example, silicon oxide. The block insulating films 53 only have to be formed of a material having a high dielectric constant and are formed of, for example, a High-k film of an oxide film containing aluminum (Al), hafnium (Hf), or zirconium (Zr). The block insulating films 53 may be formed of silicon nitride. The barrier metal films 23 are formed of, for example, titanium nitride (TiN). The conductive members 24 are formed of, for example, tungsten.

A method for manufacturing the semiconductor memory device according to the embodiment is described.

FIGS. 5A to 28 are plan views and sectional views illustrating the method for manufacturing the semiconductor memory device according to the embodiment. FIG. 7 is equivalent to a sectional view taken along line B-B' shown in FIG. 1. FIGS. 10, 11, 13, 21A, 22A, 23A, 24A, and 27 are equivalent to a region F shown in FIG. 9. FIGS. 20B, 21B, 22B, 23B, 25, 26, and 28 are equivalent to a region J shown in FIG. 4. FIG. 24B is equivalent to a region K shown in FIG. 4.

Figure 5A:
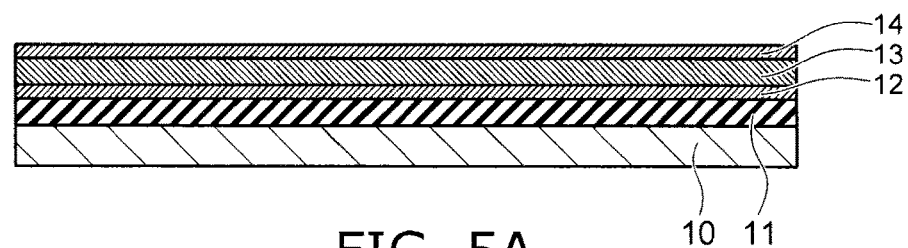
FIGS. 5A, 5B and 5C are sectional views illustrating the method for manufacturing the semiconductor memory device according to the embodiment.

As shown in FIG. 5A, for example, a silicon oxide film is deposited to form the insulating film 11 on the silicon substrate 10. The conductive layer 12, the interconnect layer 13, and the conductive layer 14 are stacked on the insulating film 11 in this order.

Figure 5B:
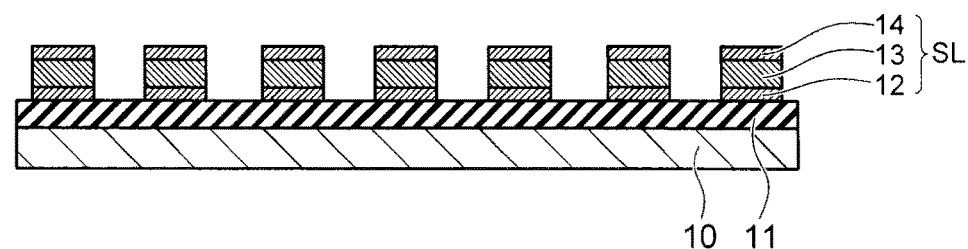

As shown in FIG. 5B, a range in which the source lines SL are formed by lithography is specified. By applying dry etching, the conductive layer 12, the interconnect layer 13, and the conductive layer 14 are selectively removed to form the source lines SL mutually distal in the Y-direction and the X-direction.

Figure 5C:
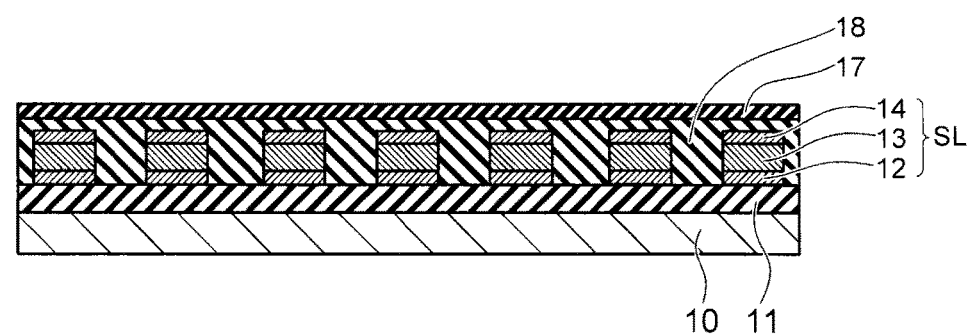
Figure 5C:
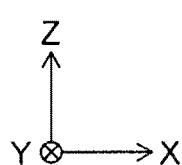

As shown in FIG. 5C, an insulating material is deposited on the upper surface of the insulating film 11 and the surfaces of the source lines SL and the upper surface is planarized to form the insulating member 18. The insulating film 17 is formed on the insulating member 18.

Figure 6:
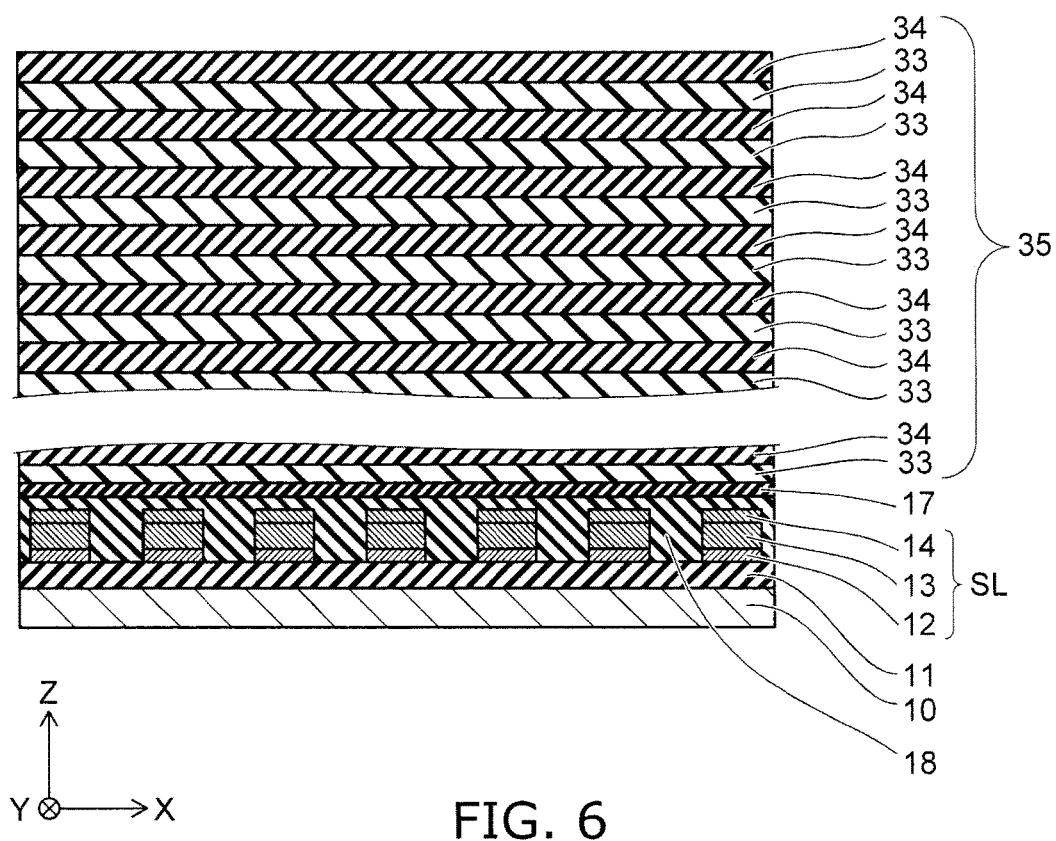
FIG. 6 is a sectional view illustrating the method for manufacturing the semiconductor memory device according to the embodiment.
Figure 7:
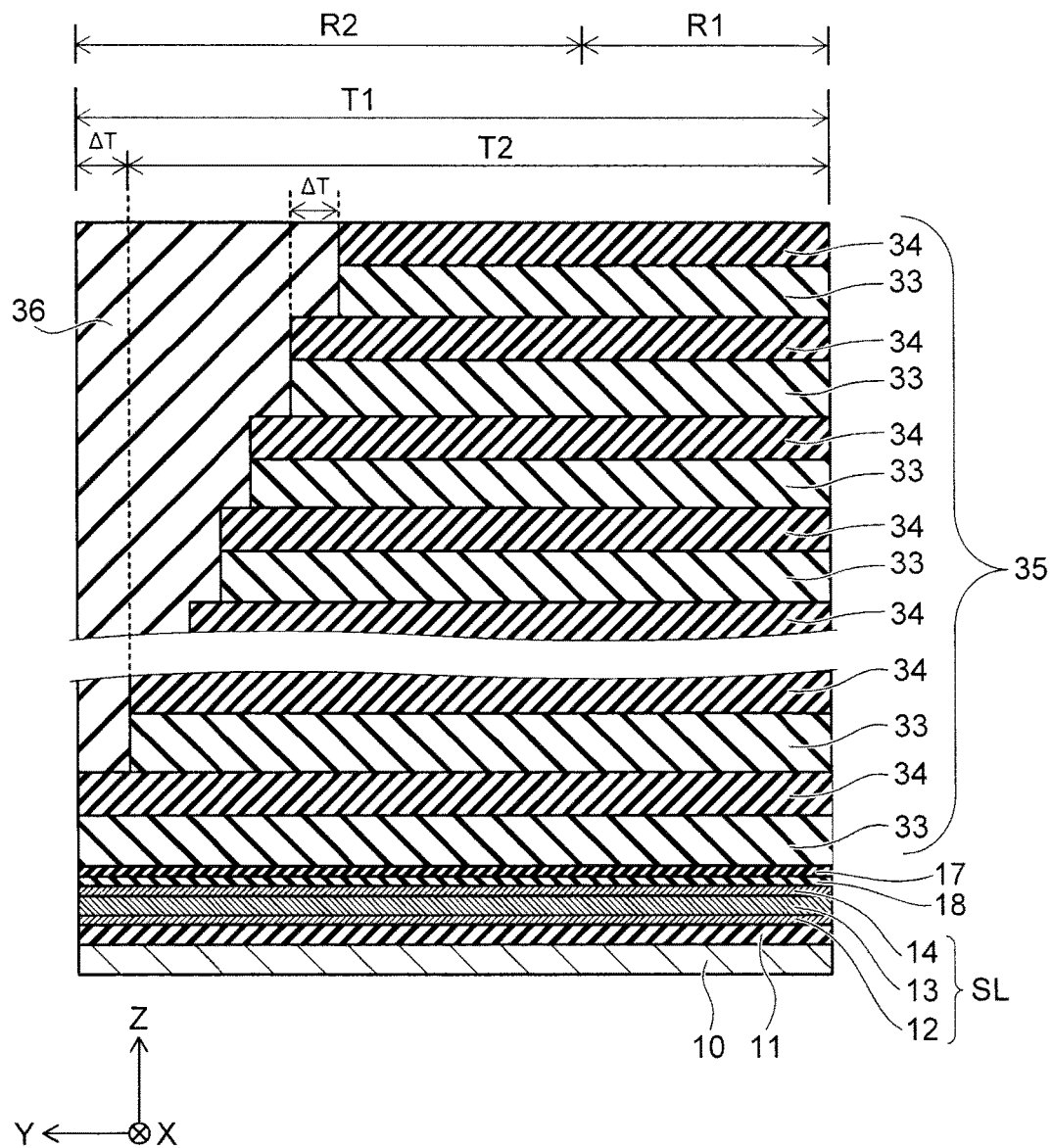
FIG. 7 is a sectional view illustrating the method for manufacturing the semiconductor memory device according to the embodiment.

As shown in FIG. 6, for example, the insulating films 33 containing silicon oxide and filling films 34 containing silicon nitride are alternately stacked by a CVD (Chemical Vapor Deposition) method to form a stacked body 35. Thereafter, the insulating films 33 and the filling films 34 in the contact region R2 on the Y-direction side of the stacked body 35 are processed in a step shape. That is, as shown in FIG. 7, length T2 in the Y-direction of the insulating film 33 and the filling film 34 in the second layer is set shorter than length T1 in the Y-direction of the insulating film 33 and the filling film 34 in the first layer by length ΔT. Length T in the Y-direction of the insulating films 33 and the filling films 34 is reduced by ΔT every time the insulating films 33 and the filling films 34 are stacked. An insulating material is deposited on a portion processed in the step shape in the contact region R2 of the stacked body 35 and the upper surface is planarized to form an insulating film 36.

Figure 8:
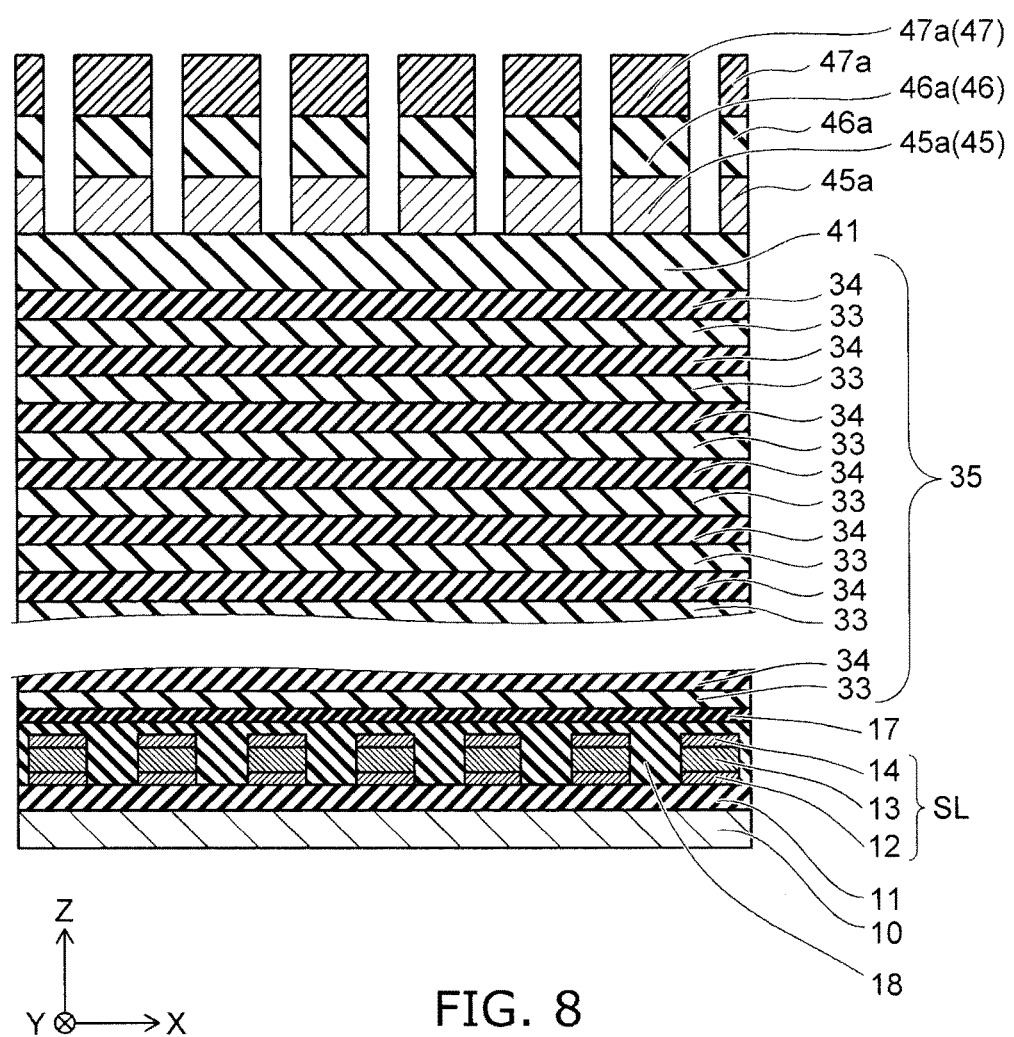
FIGS. 8 to 13 are sectional views illustrating the method for manufacturing the semiconductor memory device according to the embodiment.

As shown in FIG. 8, for example, silicon oxide ($SiO_2$) is deposited by the CVD method using TEOS (Tetra Ethyl Ortho Silicate: Si(OC2H5)4) as a material to form a mask 41 on the stacked body 35. For example, a pattern film 45 made of a carbon (C) film is formed on the mask 41. An anti reflective coating (ARC) 46 is formed on the pattern film 45. A resist film 47 is formed on the anti reflective coating 46.

Thereafter, by exposing and developing the resist film 47, resist patterns 47a extending in the Y-direction and separated from one another in the X-direction are formed. By applying etching, the anti reflective coating 46 and the pattern film 45 are also separated in the X-direction like the resist patterns 47a to form anti reflective coatings 46a and pattern films 45a.

Figure 9:
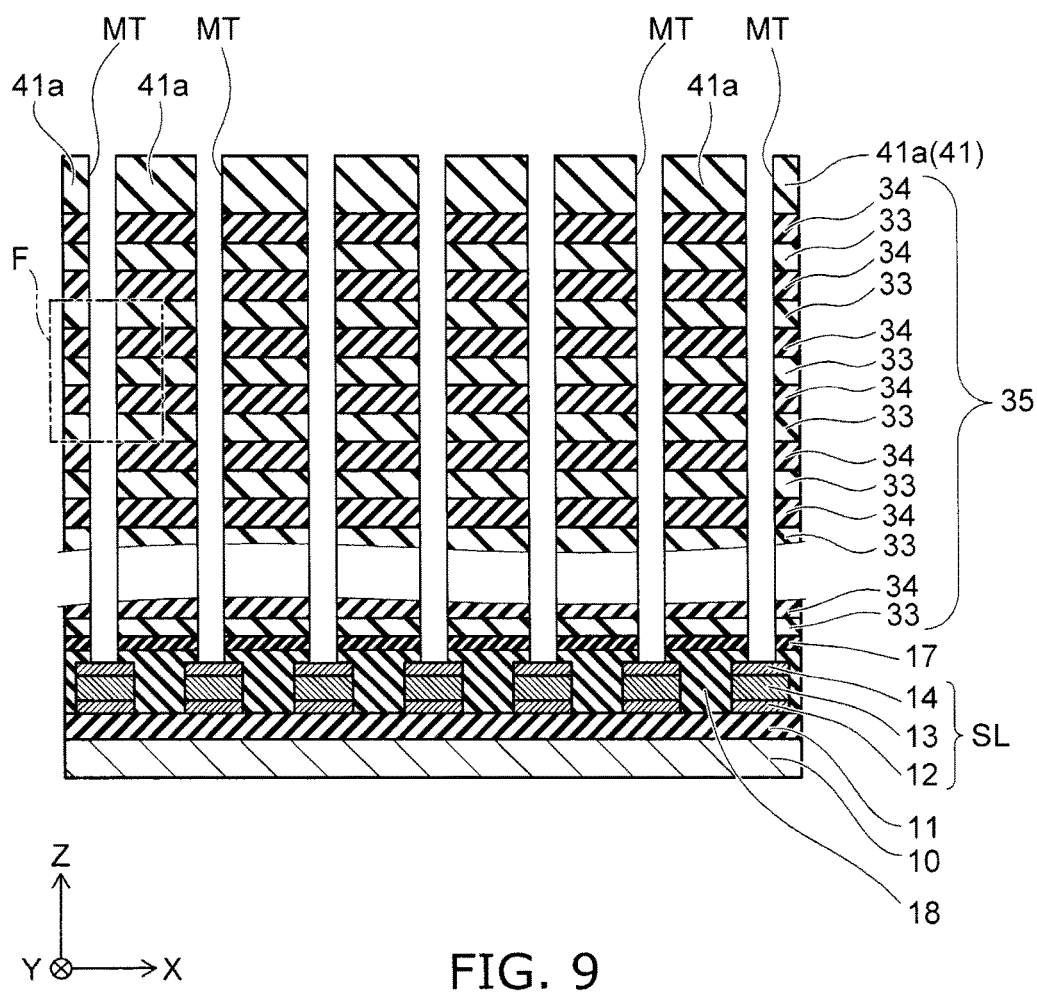

As shown in FIG. 9, the mask 41 is patterned to form masks 41a extending in the Y-direction and separated from one another in the X-direction. For example, wet etching is applied with the masks 41a as masks to form groove-like memory cell trenches MT that reach the source lines SL piercing through the stacked body 35 and the insulating film 17 in the Z-direction and expand along a YZ plane.

Figure 10:
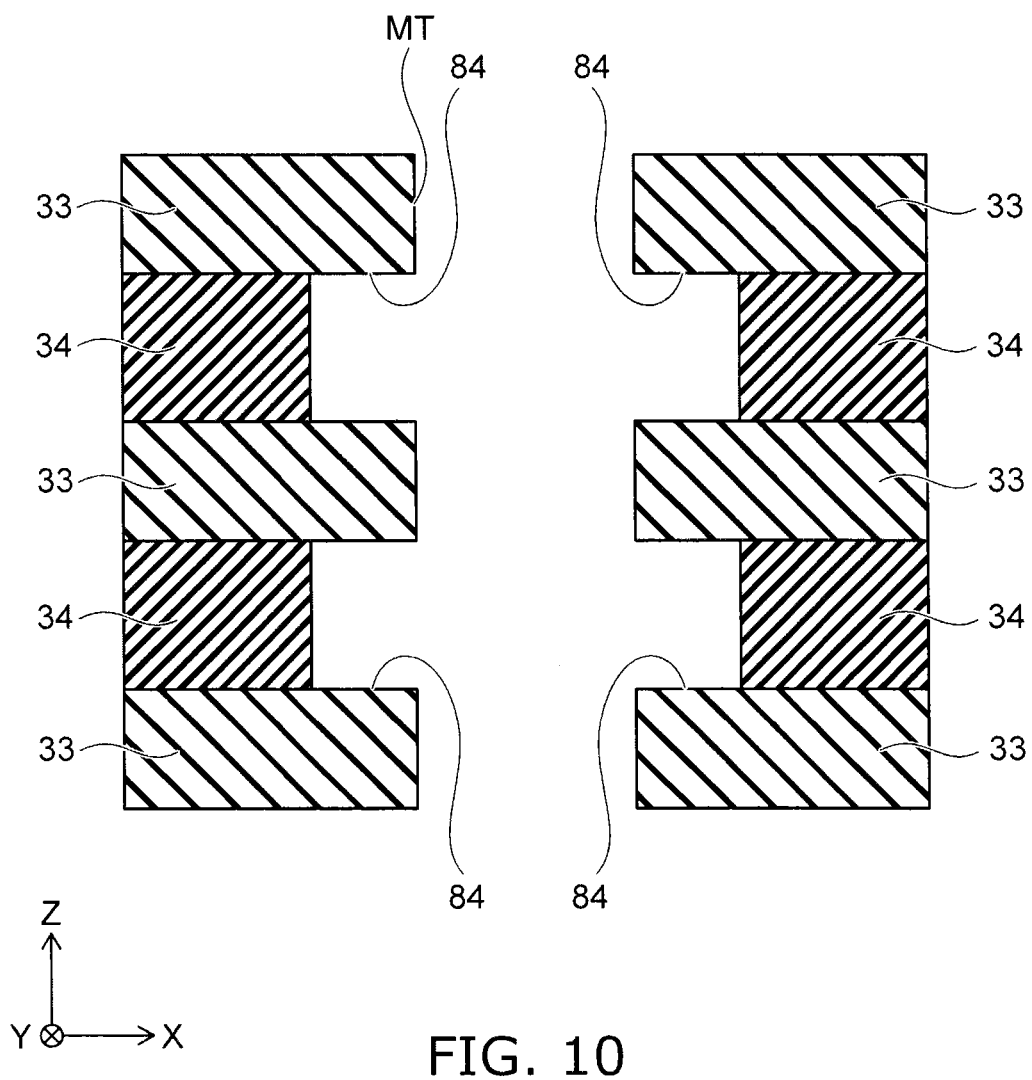

As shown in FIG. 10, for example, wet etching is performed using hot phosphoric acid ($H_3PO_4$) via the memory cell trenches MT. Consequently, a part on the memory cell trenches MT side of the filling film 34 is removed to form hollows 84 on the side surfaces of the memory cell trenches MT.

Figure 11:
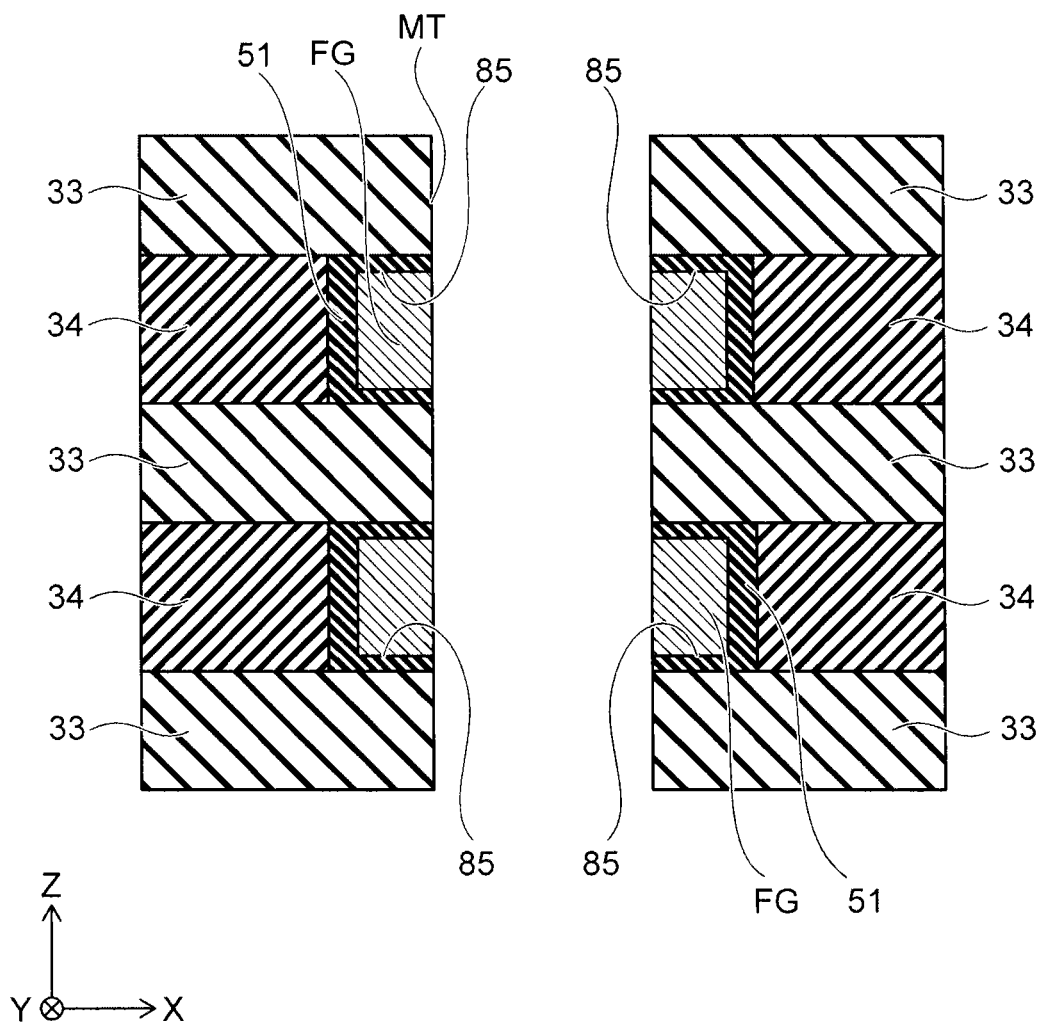

As shown in FIG. 11, for example, a silicon nitride film, a silicon nitride film containing metal, or a hafnium oxide film is formed by the CVD method on the side surfaces of the memory cell trenches MT and the inner surfaces of the hollows 84 to form the block insulating films 51. Since the block insulating films 51 are formed at substantially equal thickness, hollows 85 reflecting the hollows 84 are formed on the surfaces of the block insulating films 51. For example, polysilicon is deposited on the surfaces of the block insulating films 51 to form the floating gate electrodes FG. At this point, the hollows 85 are filled with polysilicon.

For example, wet etching is performed using TMY (choline aqueous solution) as an etchant to remove the floating gate electrodes FG provided on the side surfaces of the memory cell trenches MT. Wet etching is performed using hot phosphoric acid to remove the block insulating films 51 provided on the side surfaces of the memory cell trenches MT to expose the insulating films 33. Consequently, the block insulating films 51 and the floating gate electrodes FG are divided into layers in the Z-direction.

Figure 12:
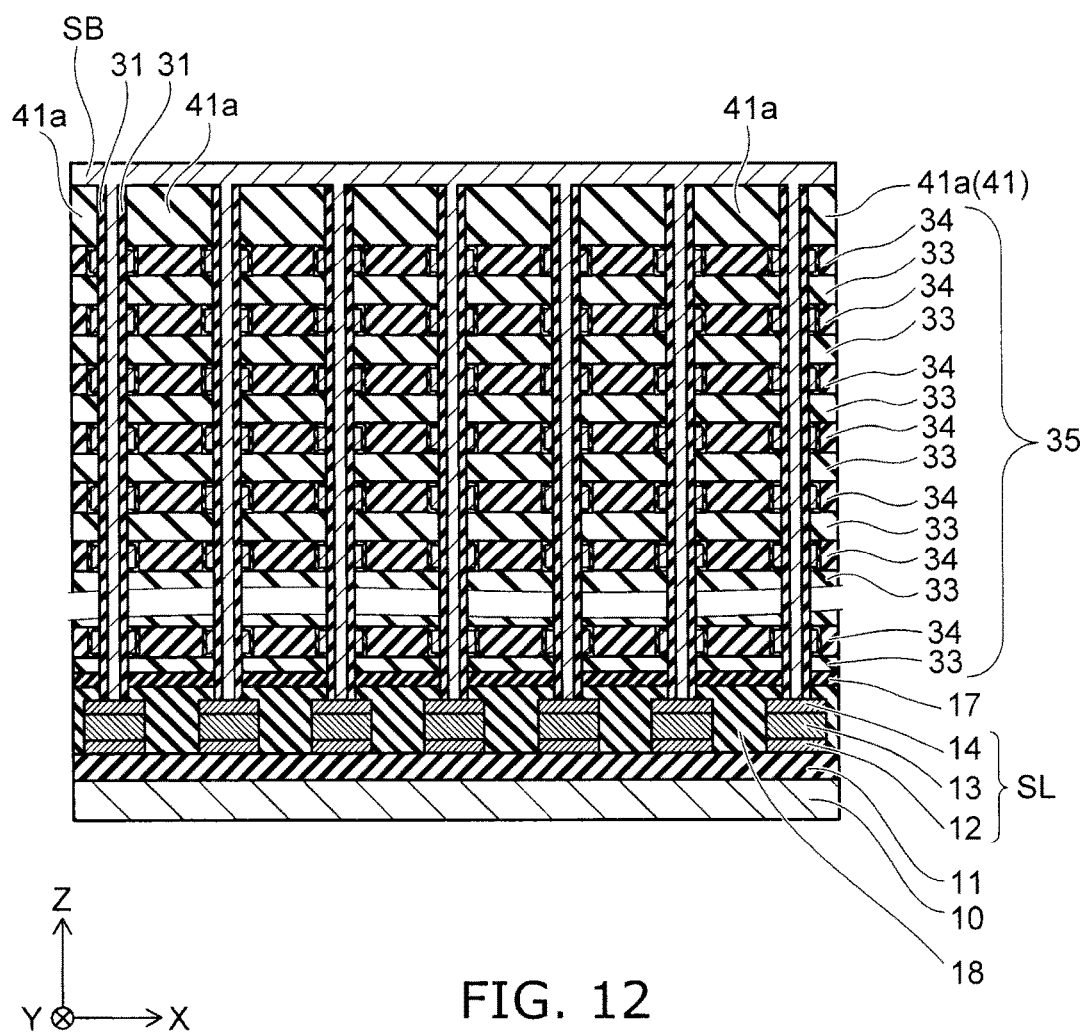
Figure 13:
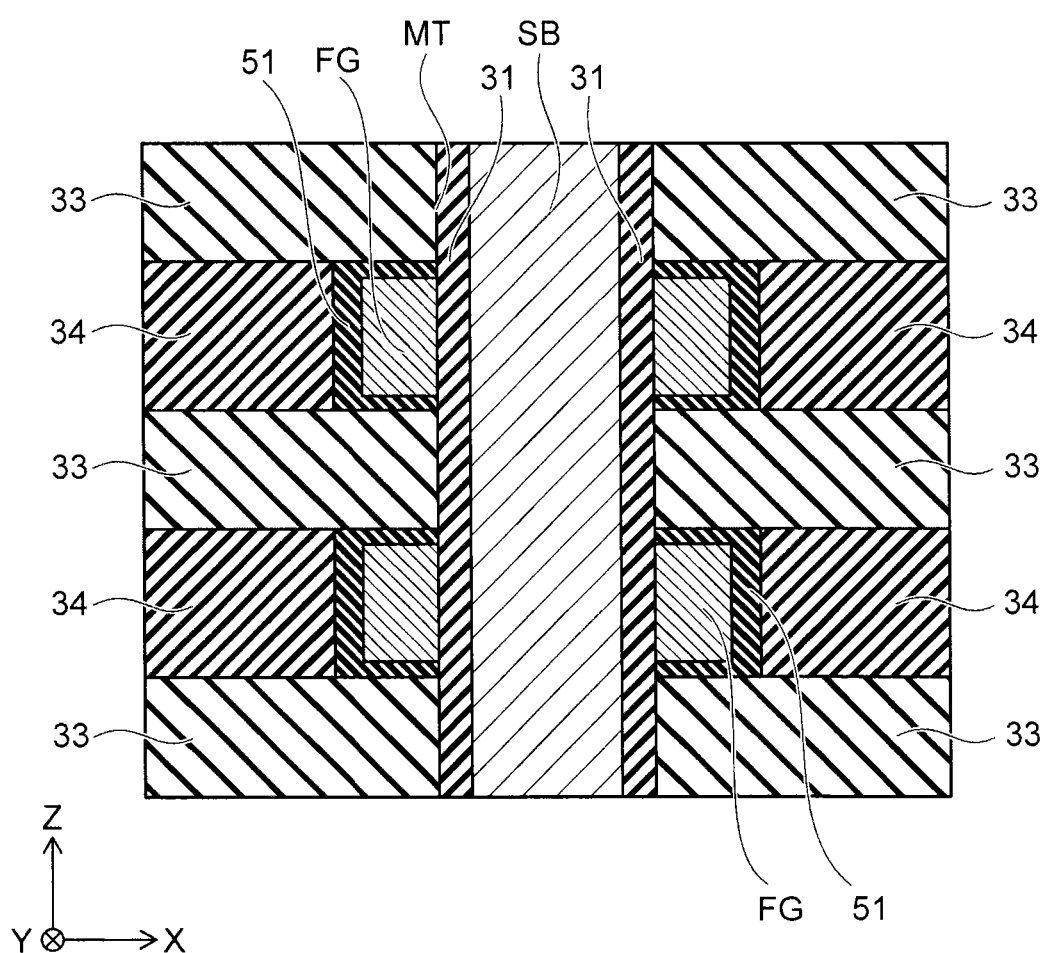

As shown in FIGS. 12 and 13, silicon oxide is deposited to form the tunnel insulating films 31 on the side surfaces of the insulating films 33, the side surfaces of the block insulating films 51, and the side surfaces of the floating gate electrodes FG by, for example, an ALD (Atomic Layer Deposition) method. For example, amorphous silicon (a-Si)

is deposited to form cover films on the surfaces of the tunnel insulating films 31. The tunnel insulating films 31 and the cover films are also formed on the bottom sections of the memory cell trenches MT. RIE is applied to remove a part of the tunnel insulating films 31 and the cover films formed on the bottom sections of the memory cell trenches MT to expose the upper surfaces of the source lines SL. For example, amorphous silicon is deposited to form core sections on the insides of the memory cell trenches MT, the upper surfaces of the tunnel insulating films 31, and the upper surfaces of the masks 41a. Thereafter, annealing is applied to crystallize the amorphous silicon of the cover films and the amorphous silicon of the core sections and form a silicon body SB.

Figure 14A:
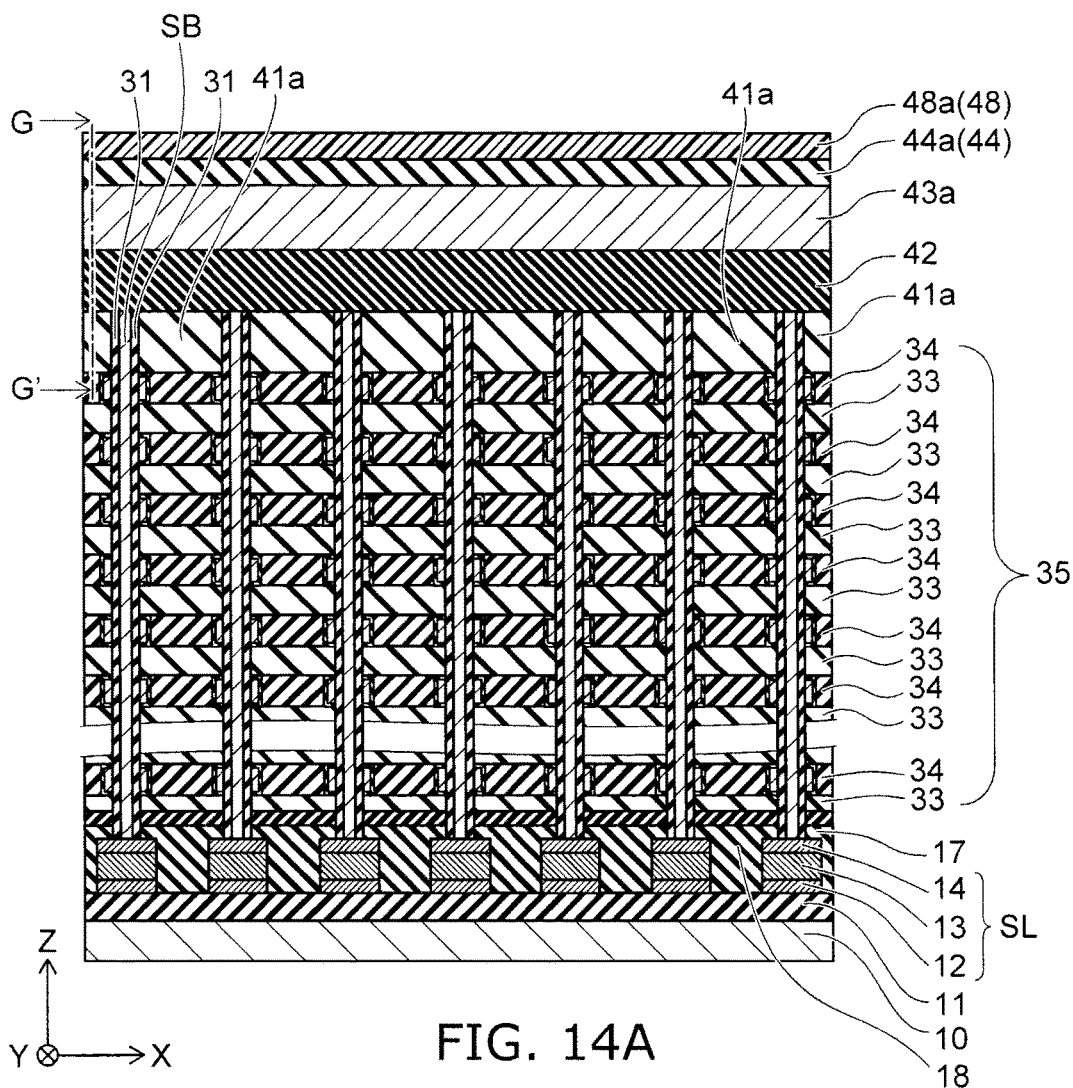
FIG. 14A is a sectional view illustrating the method for manufacturing the semiconductor memory device according to the embodiment.
Figure 14B:
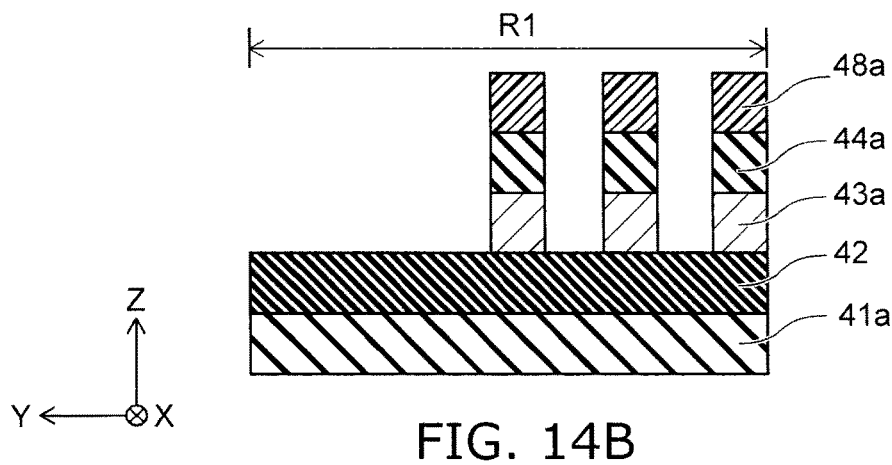
FIG. 14B is a sectional view illustrating the method for manufacturing the semiconductor memory device according to the embodiment.

FIG. 14B is equivalent to a sectional view taken along line G-G' shown in FIG. 14A.

As shown in FIGS. 14A and 14B, the silicon body SB is etched back to retract the upper surface of the silicon body SB and expose the upper surfaces of the tunnel insulating films 31 and the upper surfaces of the masks 41a. For example, silicon oxide ($SiO_2$) is deposited by the CVD method using TEOS as a material to form a mask 42 on the tunnel insulating films 31, the silicon body SB, and the masks 41a. A pattern film 43 is formed on the mask 42. An anti reflective coating 44 is formed on the pattern film 43. A resist film 48 is formed on the anti reflective coating 44.

Thereafter, by exposing and developing the resist film 48, resist patterns 48a extending in the X-direction and separated from one another in the Y-direction are formed. By applying etching, the anti reflective coating 44 and the pattern film 43 are also separated in the Y-direction like the resist pattern 48a. Anti reflective coatings 44a and pattern films 43a are formed.

Figure 15A:
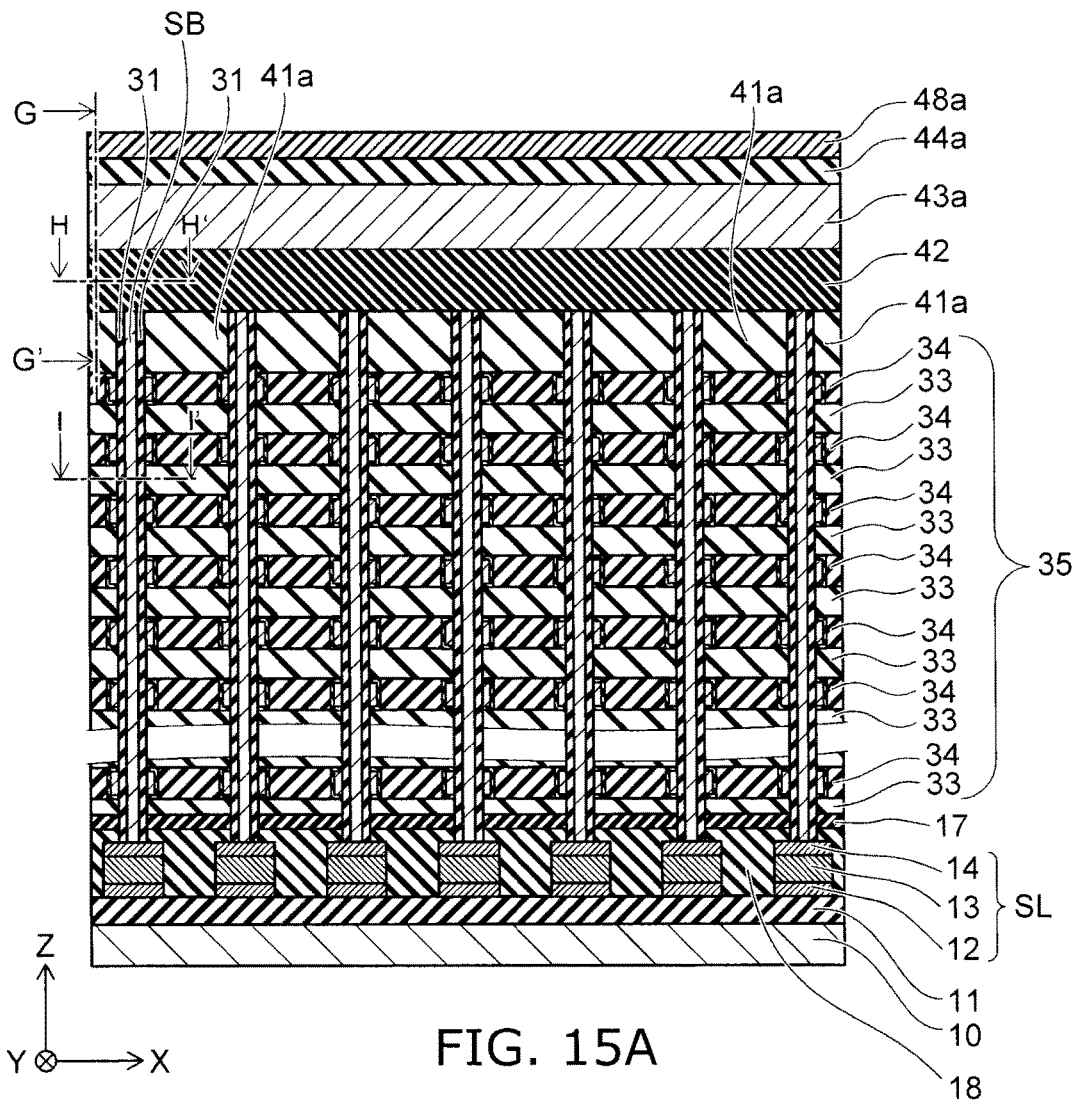
FIG. 15A is a sectional view illustrating the method for manufacturing the semiconductor memory device according to the embodiment.
Figure 15B:
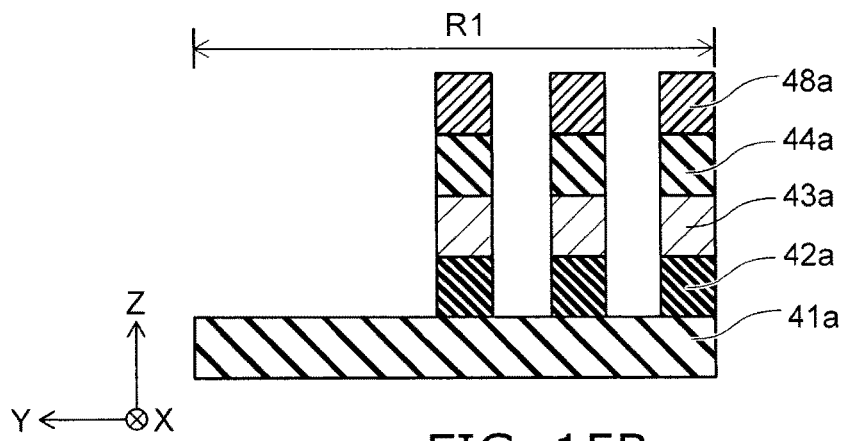
FIG. 15B is a sectional view illustrating the method for manufacturing the semiconductor memory device according to the embodiment.

FIG. 15B is equivalent to a sectional view taken along line G-G' shown in FIG. 15A.

As shown in FIGS. 15A and 15B, the mask 42 is patterned to form patterned masks 42a. The masks extend in the X-direction and are separated from one another in the Y-direction.

Figure 16A:
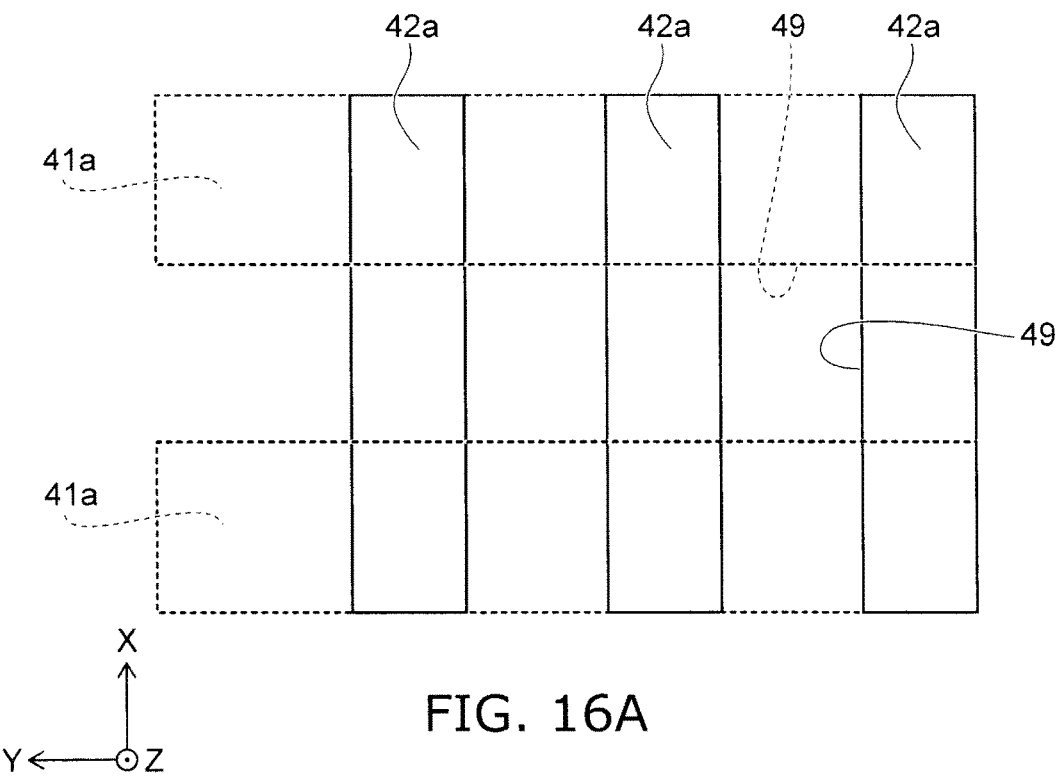
FIG. 16A is a plan view illustrating the method for manufacturing the semiconductor memory device according to the embodiment.

FIG. 16A is equivalent to a plan view taken along line H-H' shown in FIG. 15A.

As shown in FIG. 16A, the masks 41a extend in the Y-direction and are separated from one another in the X-direction. The masks 42a extend in the X-direction and are separated from one another in the Y-direction. Therefore, the shape of openings 49 of a mask formed by the masks 41a and the masks 42a is a rectangular shape having the X-direction as a longitudinal direction. The openings 49 are discretely arrayed along the Y-direction in regions right above the memory cell trenches MT and are not disposed on regions right above the filling films 34.

Figure 16B:
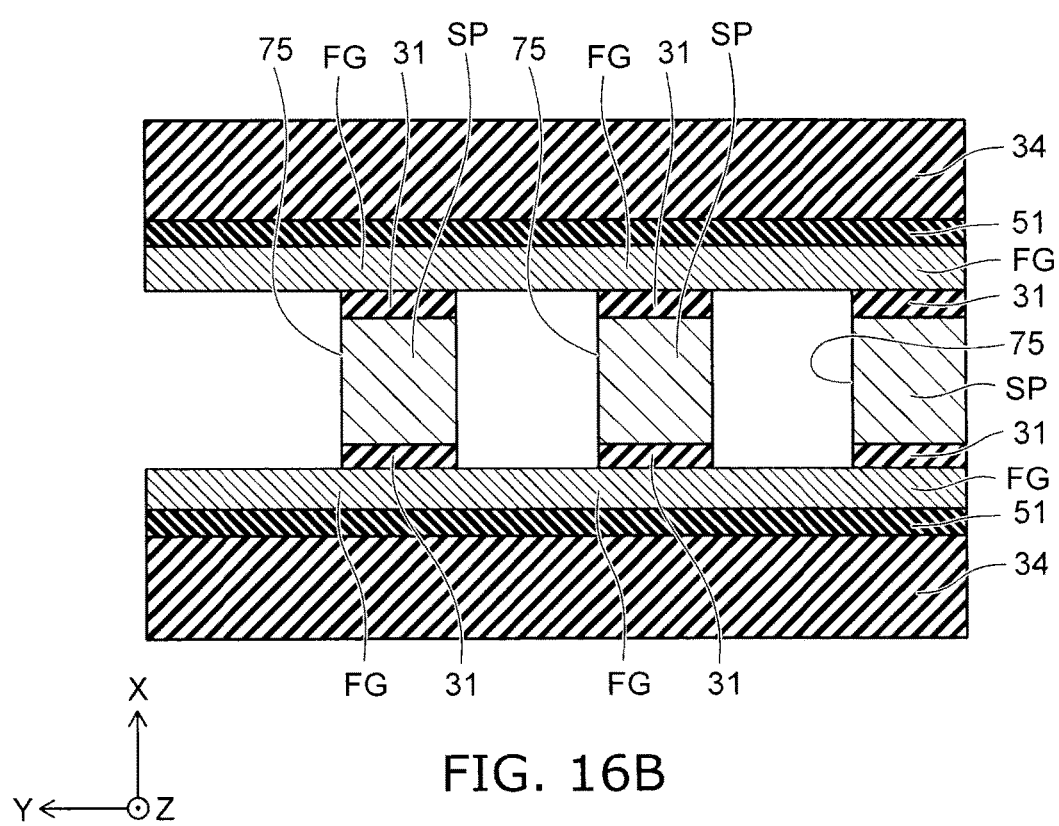
FIG. 16B is a plan view illustrating the method for manufacturing the semiconductor memory device according to the embodiment.

FIG. 16B is equivalent to a plan view taken along line I-I' shown in FIG. 15A.

As shown in FIGS. 16A and 16B, for example, wet etching is applied with the masks 41a and the masks 42a as masks to divide the silicon body SB and the tunnel insulating film 31 along the Y-direction. Consequently, through-holes 75 are formed in regions right under the openings 49 in the silicon body SB and the tunnel insulating film 31. The through-holes 75 pierce through the stacked body 35 and the insulating film 17 in the Z-direction.

The silicon body SB and the tunnel insulating film 31 are divided by the through-holes 75. The divided silicon bodies SB are referred to as silicon pillars SP.

Figure 17:
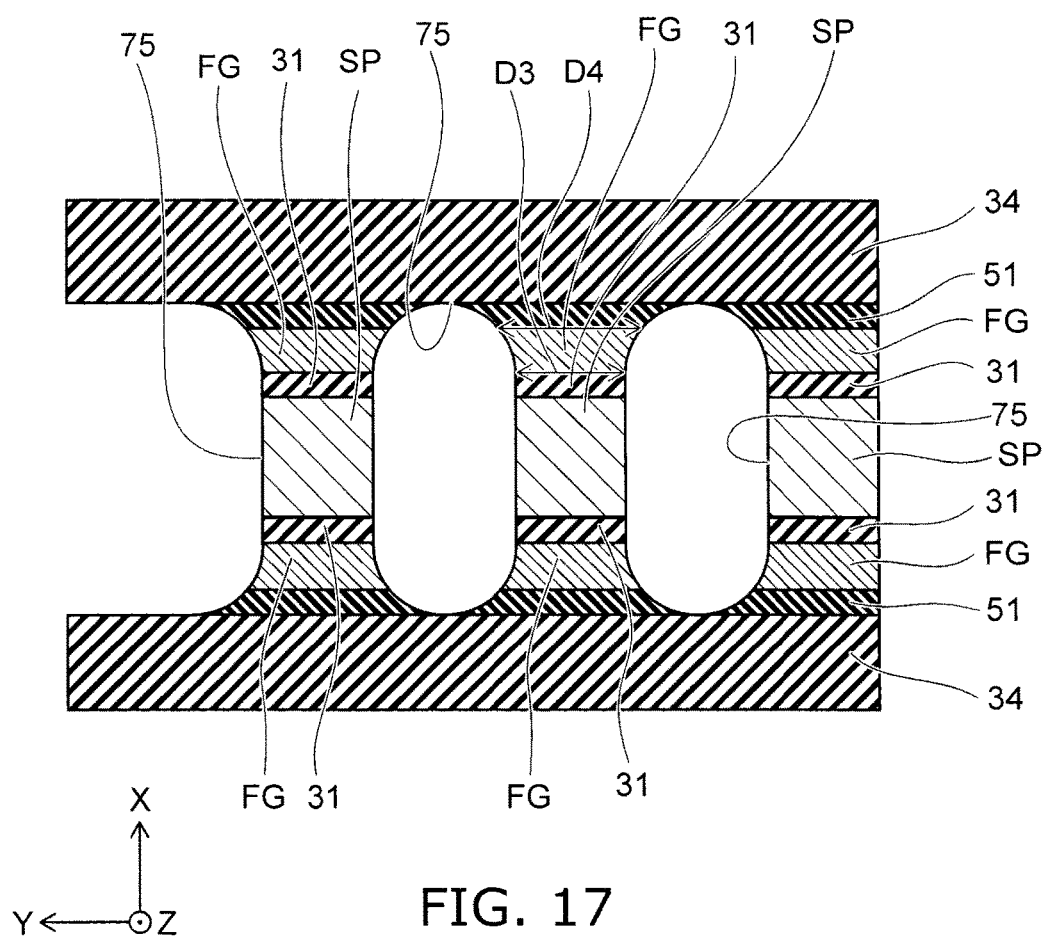
FIG. 17 is a plan view illustrating the method for manufacturing the semiconductor memory device according to the embodiment.

FIG. 17 is equivalent to a plan view taken along line I-I' shown in FIG. 15A.

As shown in FIG. 17, isotropic etching such as CDE or wet etching is applied to selectively remove the floating gate electrodes FG and the block insulating films 51 via the through-holes 75. Consequently, the floating gate electrodes FG and the block insulating films 51 are divided along the Y-direction. At this point, the floating gate electrodes FG are etched from sides where the silicon pillars SP are disposed. Therefore, length D3 in the Y-direction of the end portions on the silicon pillars SP sides in the floating gate electrodes FG is smaller than length D4 in the Y-direction at the end portions on the block insulating films 51 sides. The filling films 34 remain without being removed.

Figure 18:
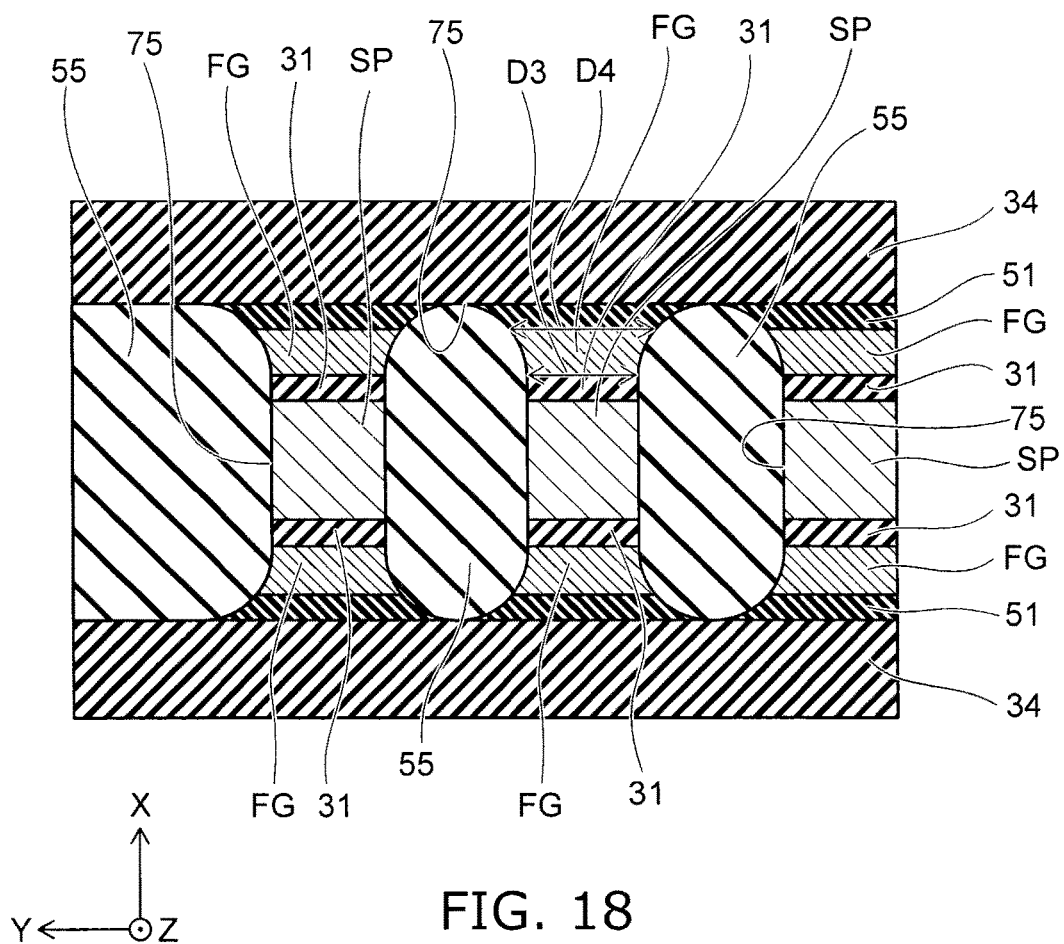
FIG. 18 is a plan view illustrating the method for manufacturing the semiconductor memory device according to the embodiment.

FIG. 18 is equivalent to a plan view taken along line I-I' shown in FIG. 15A.

As shown in FIG. 18, for example, the through-holes 75 are filled with silicon oxide to form the insulating members 55. The masks 42a, the pattern films 43a, the anti reflective coatings 44a, and the resist films 48a formed further in the Z-direction than the masks 41a are removed to planarize the upper surfaces of the masks 41a.

Figure 19A:
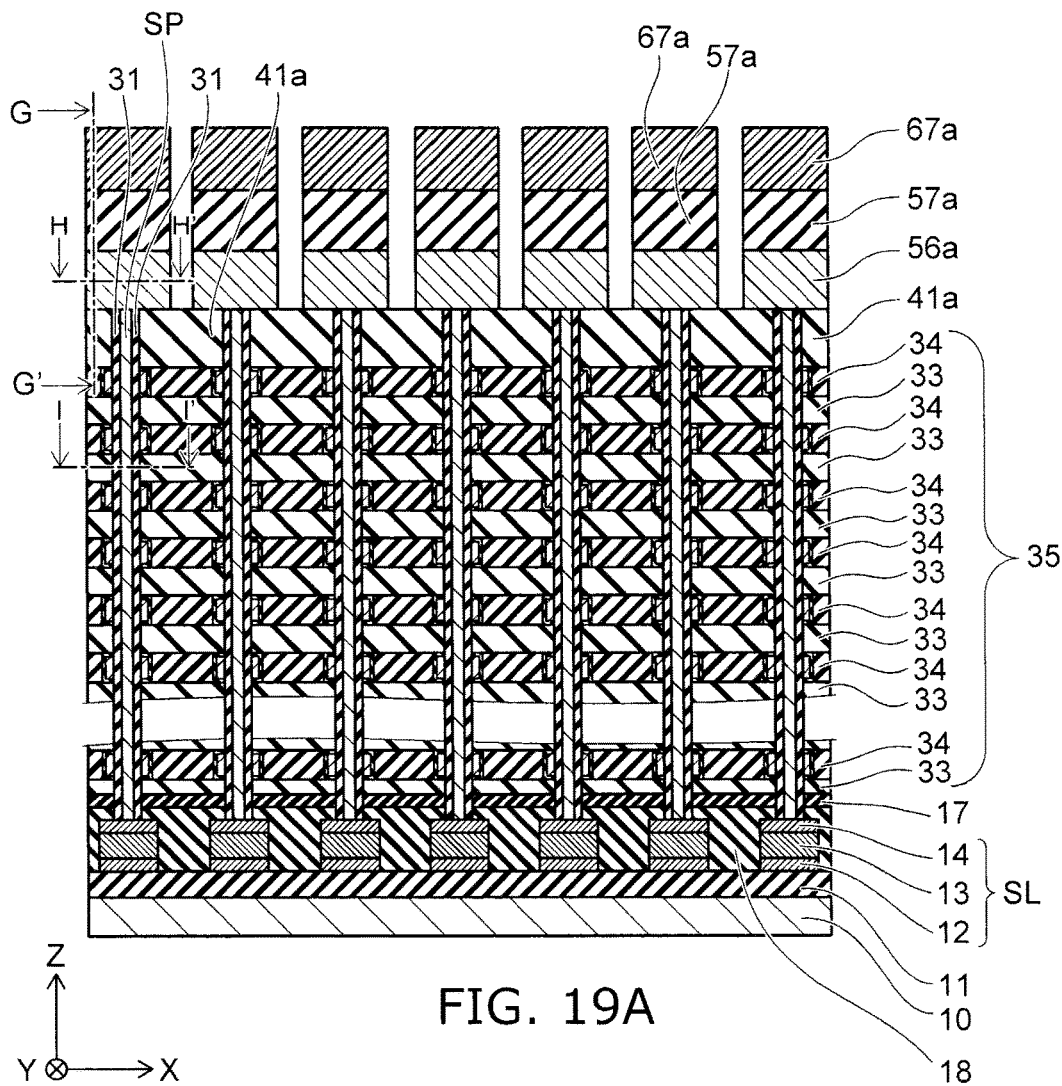
FIG. 19A is a sectional view illustrating the method for manufacturing the semiconductor memory device according to the embodiment.
Figure 19B:
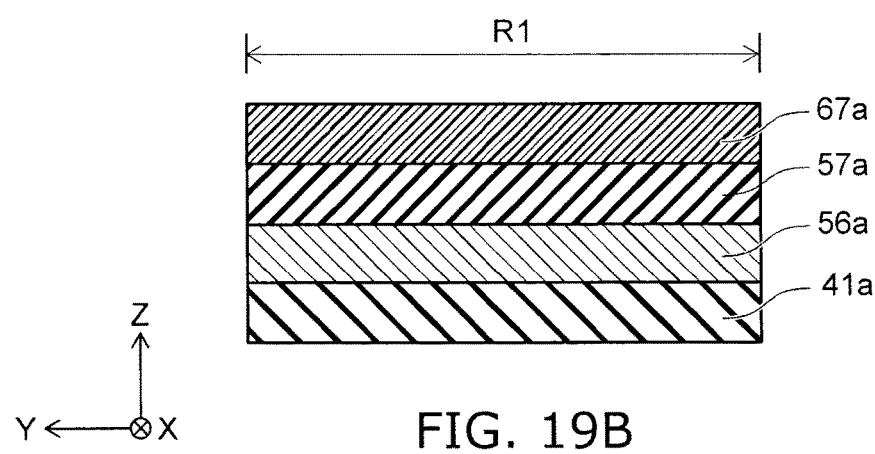
FIG. 19B is a sectional view illustrating the method for manufacturing the semiconductor memory device according to the embodiment.

FIG. 19B is equivalent to a sectional view taken along G-G' line shown in FIG. 19A.

As shown in FIGS. 19A and 19B, a pattern film 56 made of a carbon film is formed on the masks 41a, the tunnel insulating films 31, and the silicon pillars SP. An anti reflective coating 57 is formed on the pattern film 56. A resist film 67 is formed on the anti reflective coating 57.

Thereafter, by exposing and developing the resist film 67, resist patterns 67a extending in the Y-direction and separated from one another in the X-direction are formed. By applying etching, the anti reflective coating 57 and the pattern film 56 are also separated in the X-direction like the resist patterns 67a. Anti reflective coatings 57a and pattern films 56a are formed.

Figure 20A:
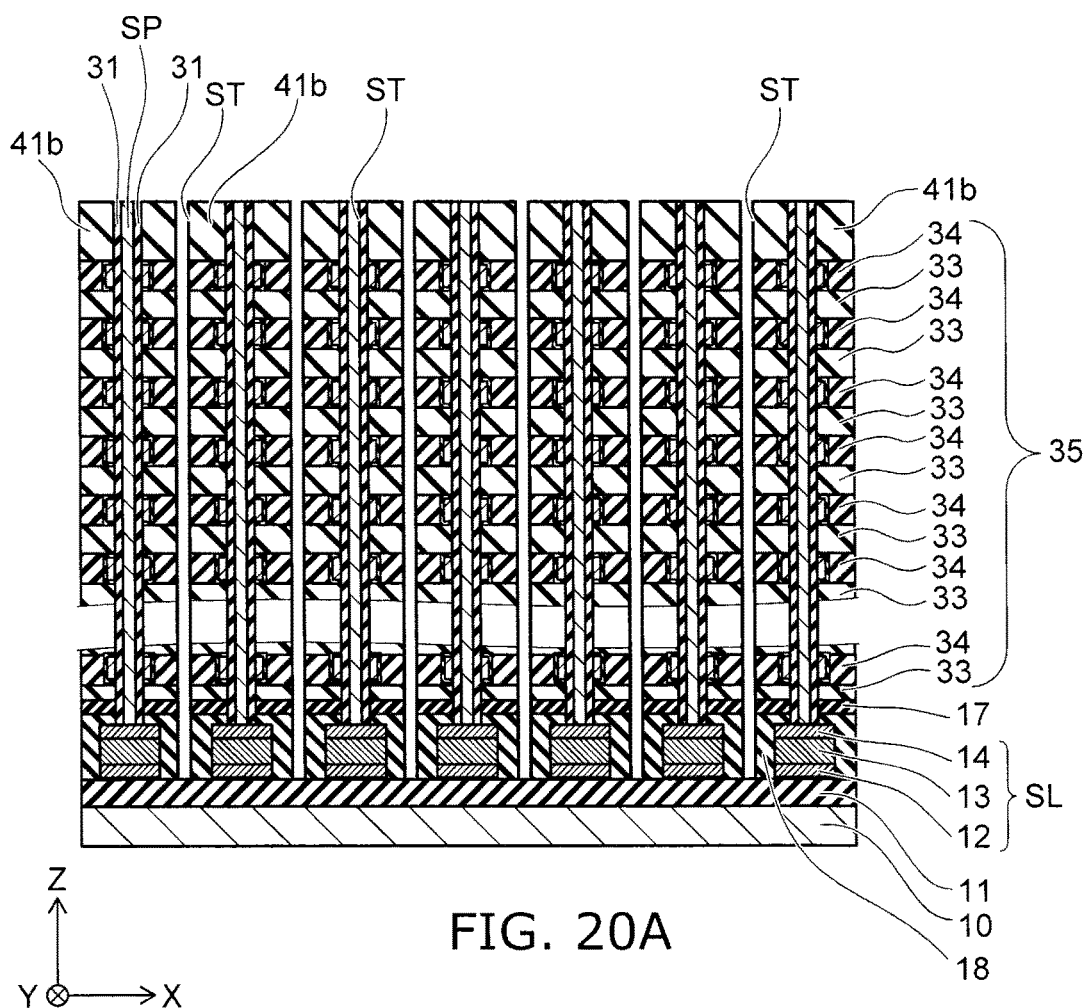
FIG. 20A is a sectional view illustrating the method for manufacturing the semiconductor memory device according to the embodiment.

As shown in FIG. 20A, the masks 41a are patterned to form masks 41b. For example, wet etching is applied with the masks 41b as masks. Consequently, on sides of the silicon pillars SP, groove-like slits ST that reach the insulating film 11 piercing through the stacked body 35 to the source lines SL in the Z-direction and expand along the YZ plane are formed.

Figure 20B:
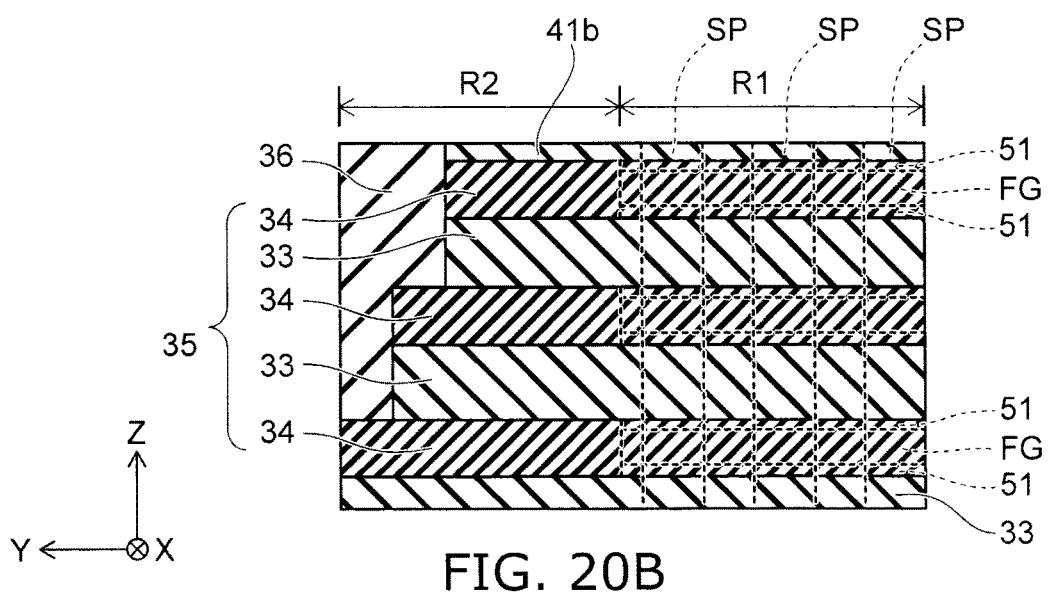
FIG. 20B is a sectional view illustrating the method for manufacturing the semiconductor memory device according to the embodiment.

As shown in FIG. 20B, in the contact region R2, the insulating films 33 and the filling films 34 are alternately stacked. The stacked body 35, Y-direction end portions of which are processed in a step shape, and the insulating film 36 disposed on a portion processed into the step shape are provided. The slits ST are formed on the X-direction side and the opposite side in the X-direction of the insulating films 33 and the filling films 34.

Figure 21A:
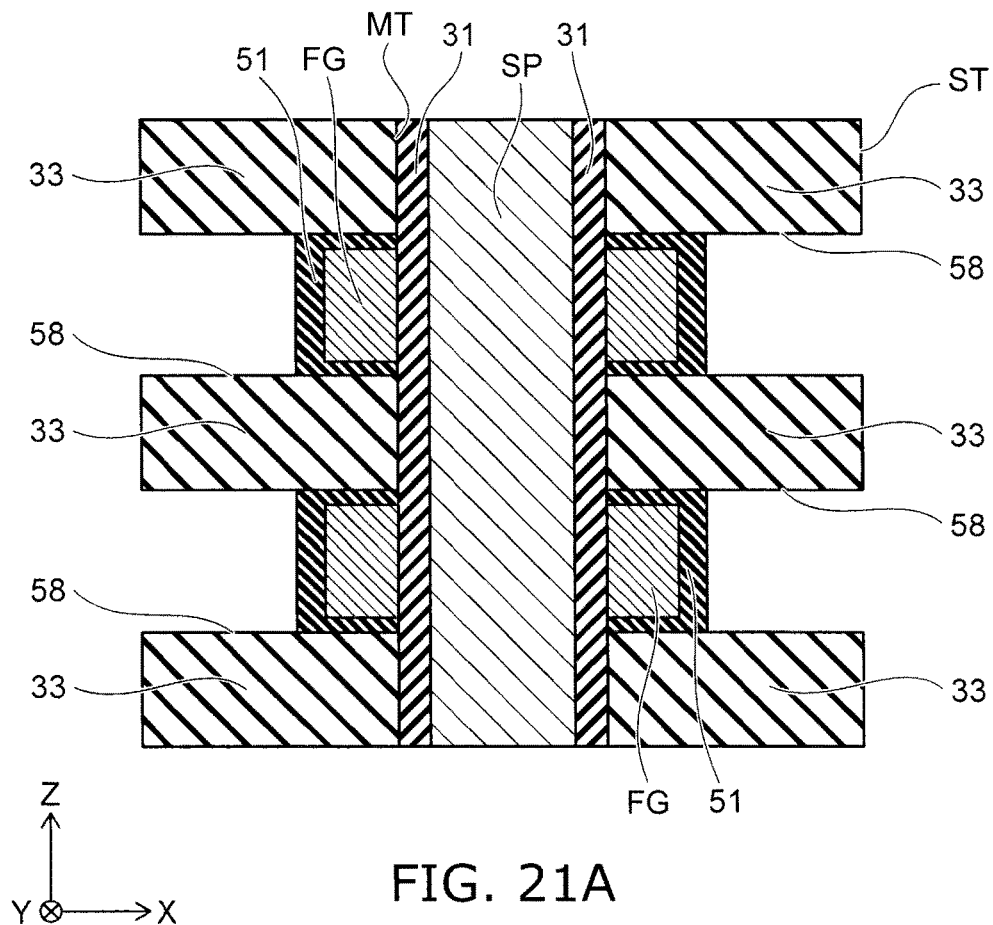
FIG. 21A is a sectional view illustrating the method for manufacturing the semiconductor memory device according to the embodiment.

As shown in FIG. 21A, for example, wet etching is performed using hot phosphoric acid, which is a chemical for removing silicon oxide, as an etchant is performed via the slits ST. Consequently, the films 34 are removed, hollows 58 are formed on the side surfaces of the slits ST, and the block insulating films 51 are exposed.

Figure 21B:
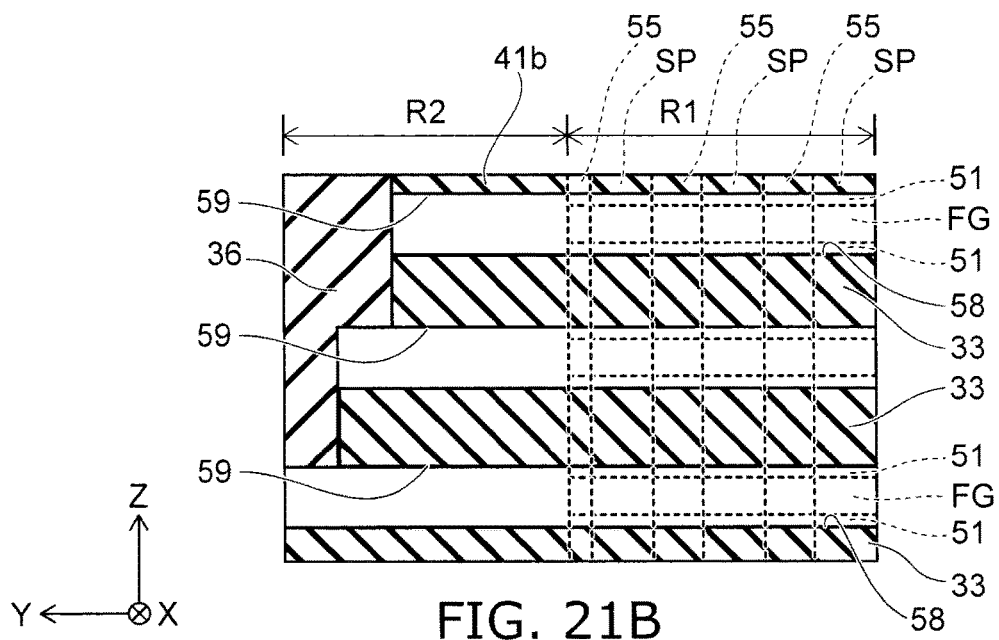
FIG. 21B is a sectional view illustrating the method for manufacturing the semiconductor memory device according to the embodiment.

As shown in FIG. 21B, the hollows 58 are contiguously formed over the memory cell region R1 and the contact region R2 and extend in the Y-direction. In the memory cell region R1, the silicon pillars SP and the insulating members 55 extending in the Z-direction are provided among the hollows 58, the positions of which in the Z-direction are equal to one another. In the contact region R2, the silicon pillars SP and the insulating members 55 are not provided among the hollows 58, the positions of which in the Z-direction are equal to one another. The hollows 58 are connected to one another. Belt-like cavities 59 extending in the X-direction are formed.

Figure 22A:
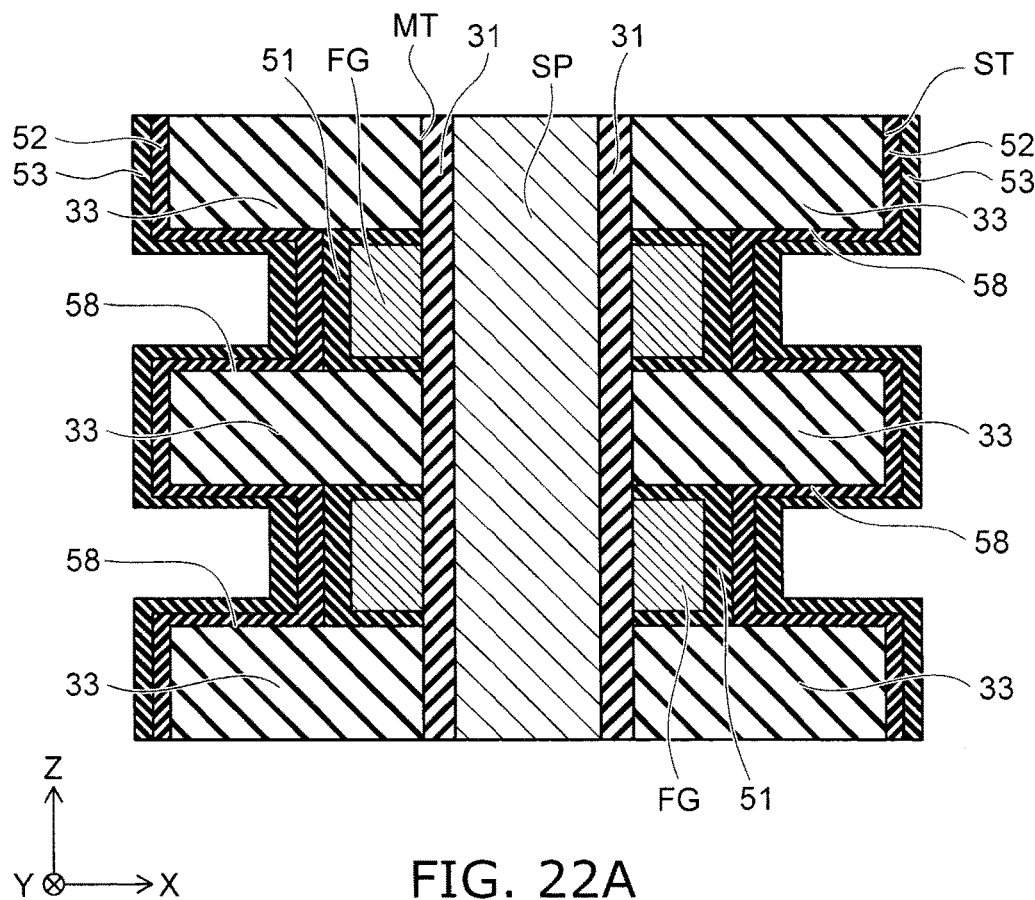
FIG. 22A is a sectional view illustrating the method for manufacturing the semiconductor memory device according to the embodiment.

As shown in FIG. 22A, for example, silicon oxide is deposited to form block insulating films 52 on the side surfaces of the slits ST and the inner surfaces of the hollows 58. Annealing is applied after the formation of the block insulating films 52. For example, hafnium silicon oxide is deposited to form block insulating films 53 on the surfaces of the block insulating films 52. In the formation of the block insulating films 52 and the block insulating films 53, the block insulating films 52 and the block insulating films 53 are formed to be substantially uniform in thickness without filling all the hollows 58.

Figure 22B:
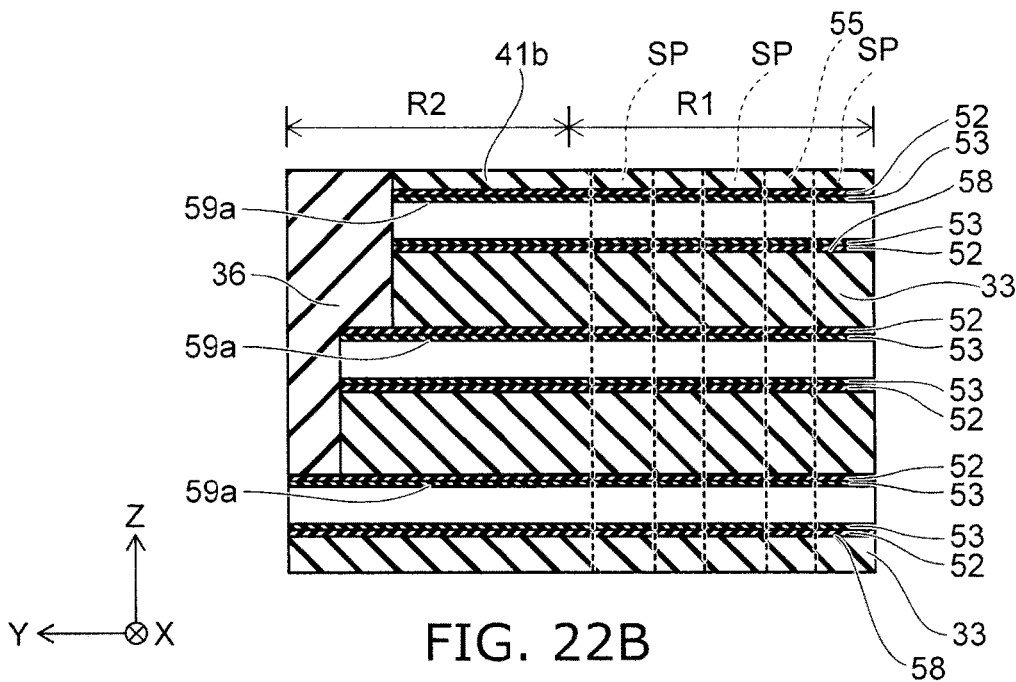
FIG. 22B is a sectional view illustrating the method for manufacturing the semiconductor memory device according to the embodiment.

As shown in FIG. 22B, the block insulating films 52 and the block insulating films 53 are contiguously formed over the memory cell region R1 and the contact region R2 and extend in the Y-direction. The block insulating films 52 and the block insulating films 53 are formed on the inner surfaces of the cavities 59 in the contact region R2. Consequently, in the contact region R2, belt-like cavities 59a reflecting the cavities 59 and extending in the X-direction are formed.

Figure 23A:
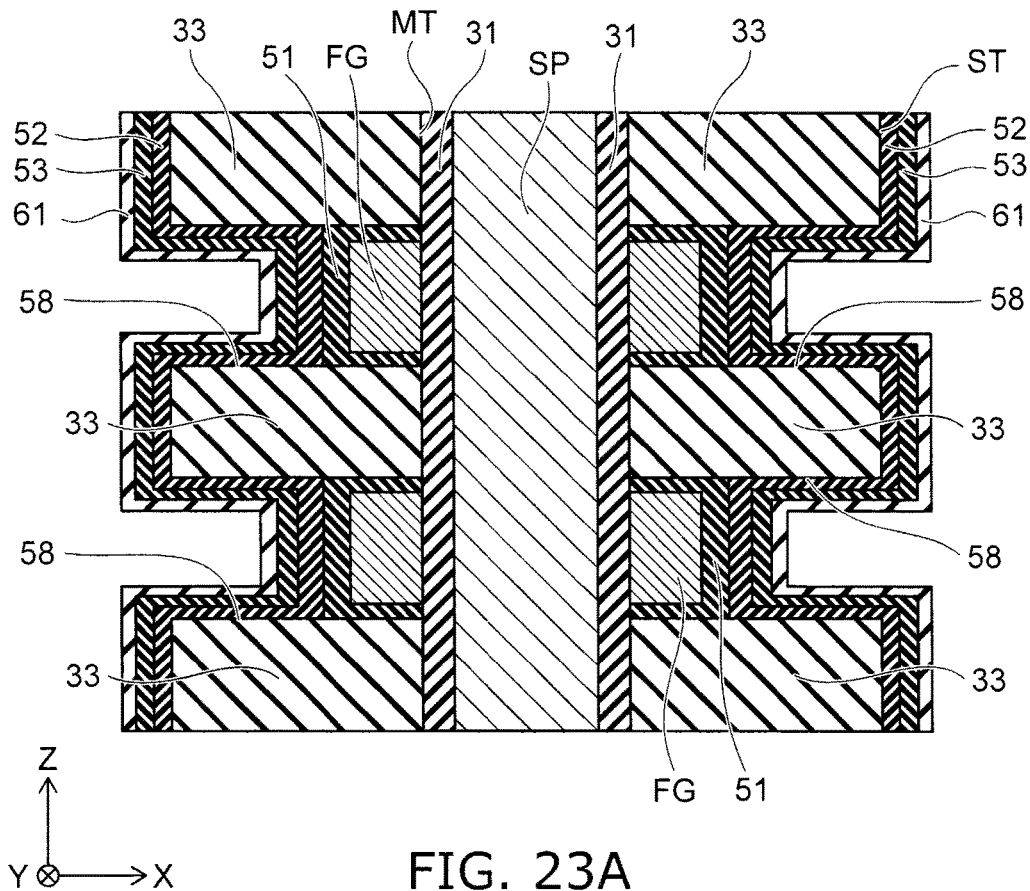
FIG. 23A is a sectional view illustrating the method for manufacturing the semiconductor memory device according to the embodiment.
Figure 23B:
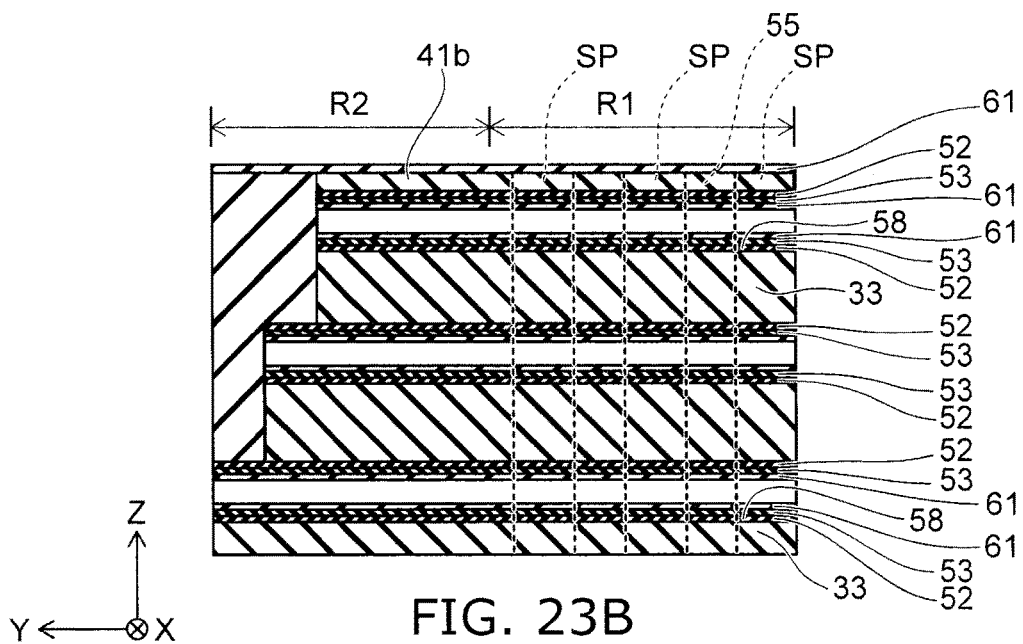
FIG. 23B is a sectional view illustrating the method for manufacturing the semiconductor memory device according to the embodiment.

As shown in FIGS. 23A and 23B, silicon oxide is deposited on the surfaces of the block insulating films 53 and the surfaces of the masks 41b to form cover films 61, for example, via the slits ST. Annealing is not applied after the formation of the cover films 61.

Figure 24A:
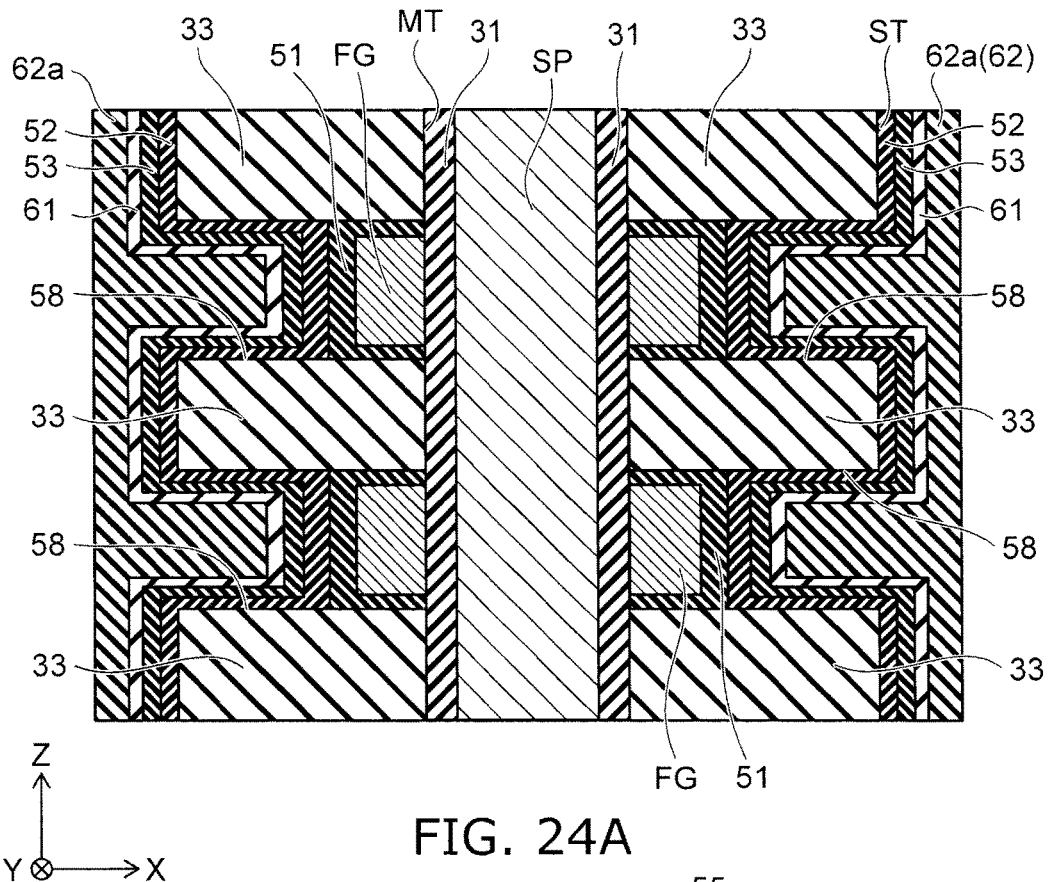
FIG. 24A is a sectional view illustrating the method for manufacturing the semiconductor memory device according to the embodiment.
Figure 24B:
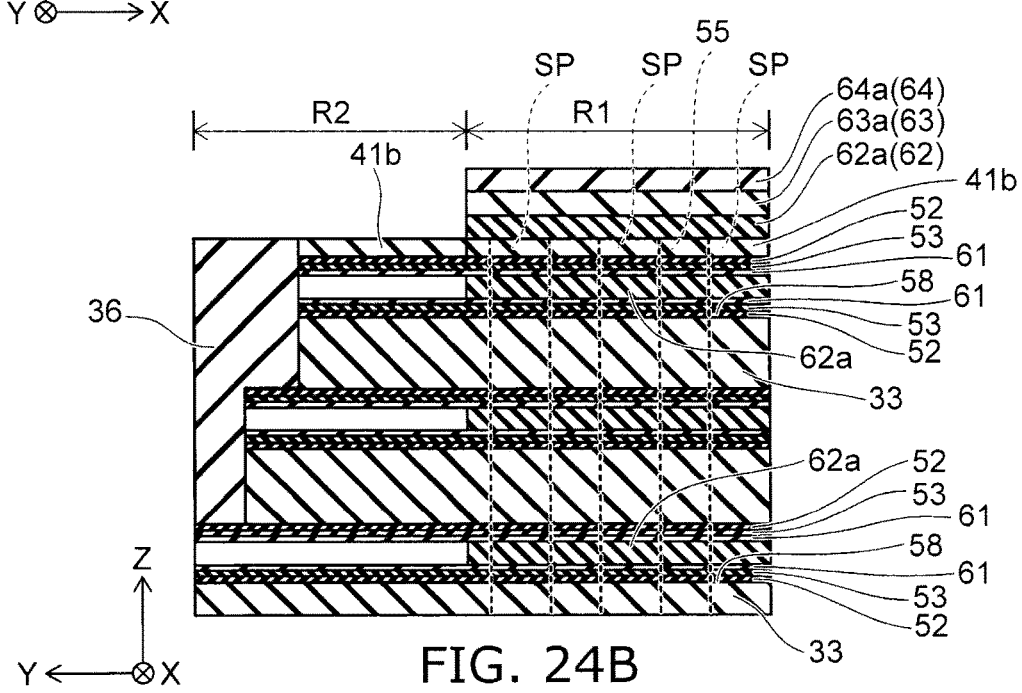
FIG. 24B is a sectional view illustrating the method for manufacturing the semiconductor memory device according to the embodiment.

As shown in FIGS. 24A and 24B, spaces in the slits ST including the hollows 58 are filled with a material for SOC (Spin On Carbon) via the slits ST. The material for SOC is deposited on the upper surfaces of the masks 41b. Consequently, an SOC film 62 is formed. A material for SOG (Spin On Glass) is deposited to form an OSG (Spin On Glass) film 63 on the SOC film 62. A resist film 64 is formed on the SOG film 63.

Therefore, by exposing and developing the resist film 64, the resist film 64 is selectively removed, the resist film 64 in the memory cell region R1 is left as it is, and the resist film 64 in the contact region R2 is removed. The left resist film 64 is referred to as resist film 64a. RIE is applied to pattern the SOG film 63 and the SOC film 62 with the resist film 64a as a mask. The patterned SOC films 62 are referred to as SOC films 62a. The patterned SOG films 63 are referred to as SOG films 63a.

Figure 25:
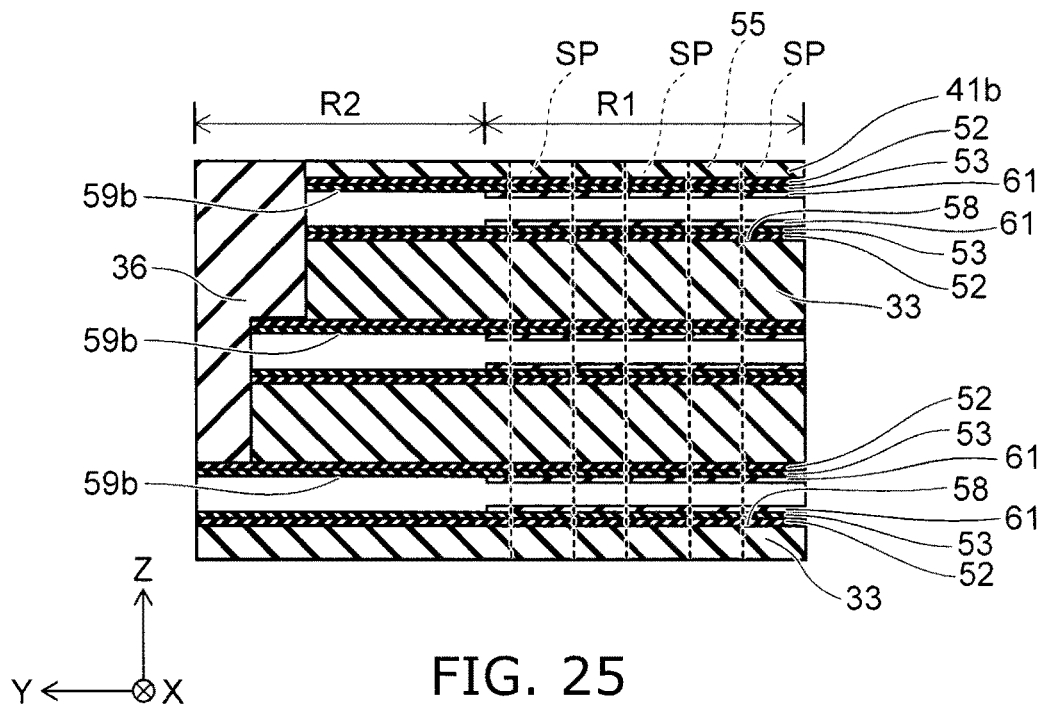
FIG. 25 is a sectional view illustrating the method for manufacturing the semiconductor memory device according to the embodiment.

As shown in FIG. 25, for example, wet etching is performed using BHF (Buffered Hydrogen Fluoride) or DHF (Diluted hydrofluoric acid) with the SOC films 62a as masks to remove the cover films 61 formed of silicon oxide. The cover films 61 in the memory cell region R1 remain on the block insulating films 53 because the cover films 61 are covered by the SOC films 62a. On the other hand, the cover films 61 in the contact region R2 are removed and the block insulating films 53 are exposed. Consequently, belt-like cavities 59b reflecting the cavities 59a and extending in the X-direction are formed.

Ashing is applied to remove all the SOC films 62a. Consequently, in the memory cell region R1, groove-like slits ST (not shown in the figure) expanding along the YZ plane are formed again on the X-direction sides and opposite sides in the X-direction of the silicon pillars SP.

Figure 26:
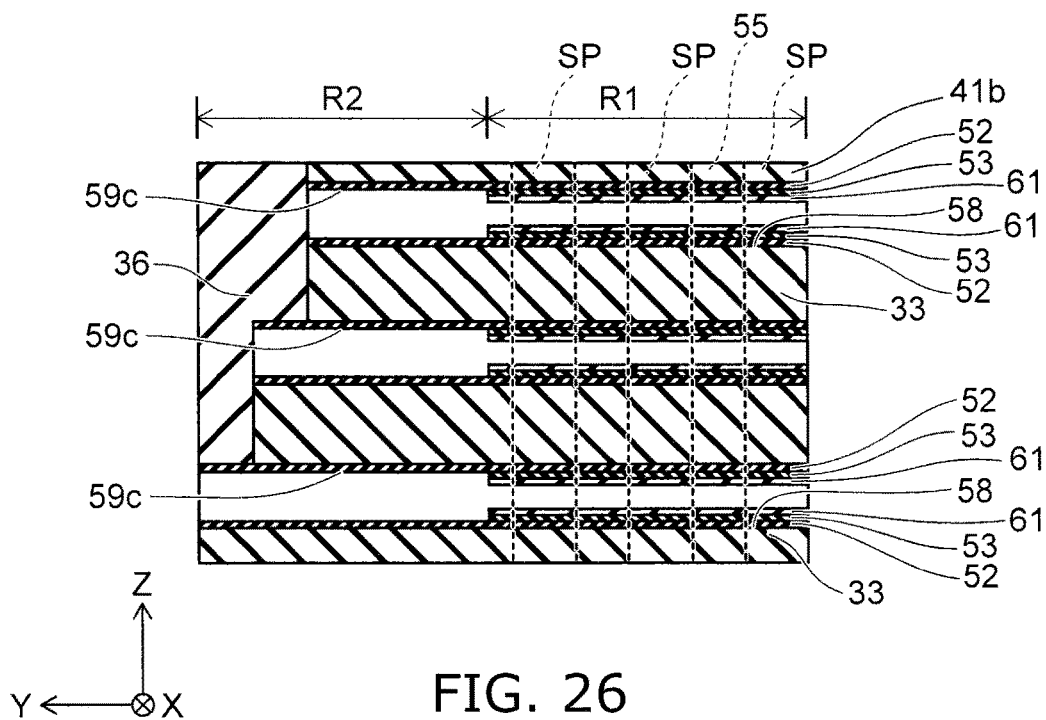
FIG. 26 is a sectional view illustrating the method for manufacturing the semiconductor memory device according to the embodiment.

As shown in FIG. 26, for example, wet etching is performed using hot phosphoric acid ($H_3PO_4$) as an etchant via the slits ST. At this point, in the memory cell region R1, the block insulating films 53 remain without being removed because the cover films 61 are used as masks. In the contact region R2, the block insulating films 53 are exposed. The block insulating films 53 provided on the block insulating films 52 are removed. Consequently, cavities 59c reflecting the cavities 59b are formed. Compared with the cavities 59b, the length of the cavities 59c in the Z-direction is larger by the length of the removed block insulating films 53.

Figure 27:
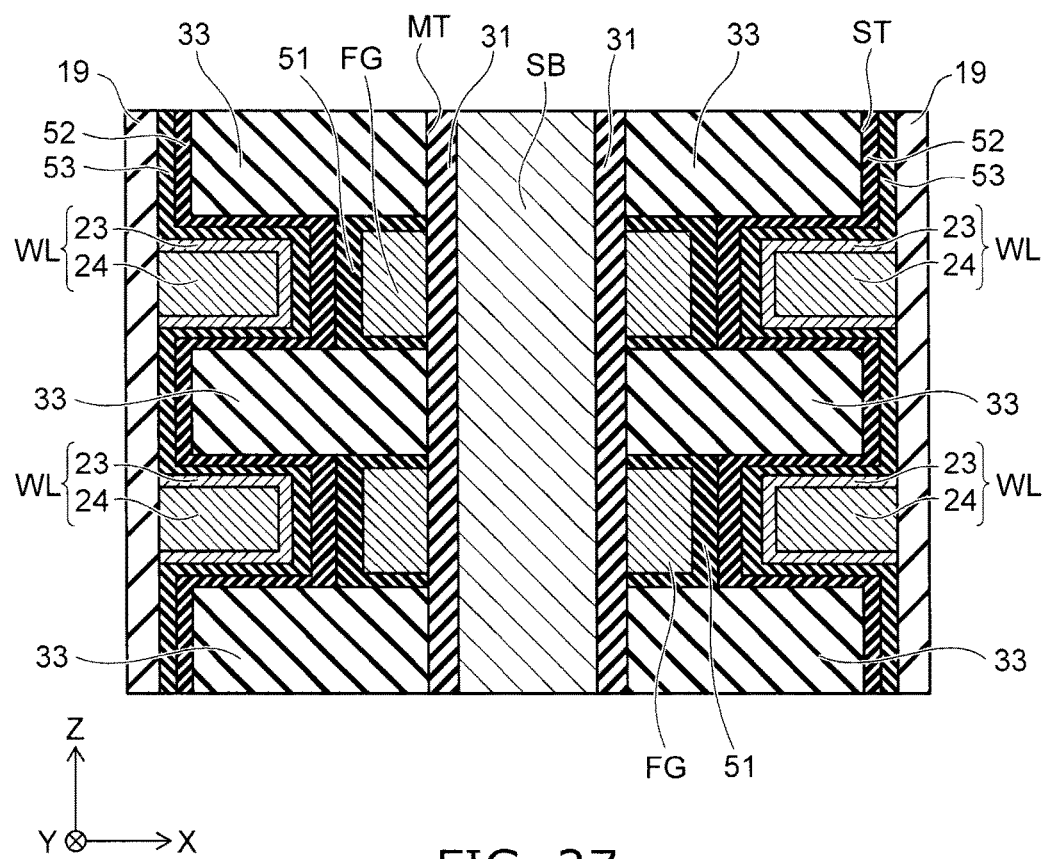
FIG. 27 is a sectional view illustrating the method for manufacturing the semiconductor memory device according to the embodiment.
Figure 28:
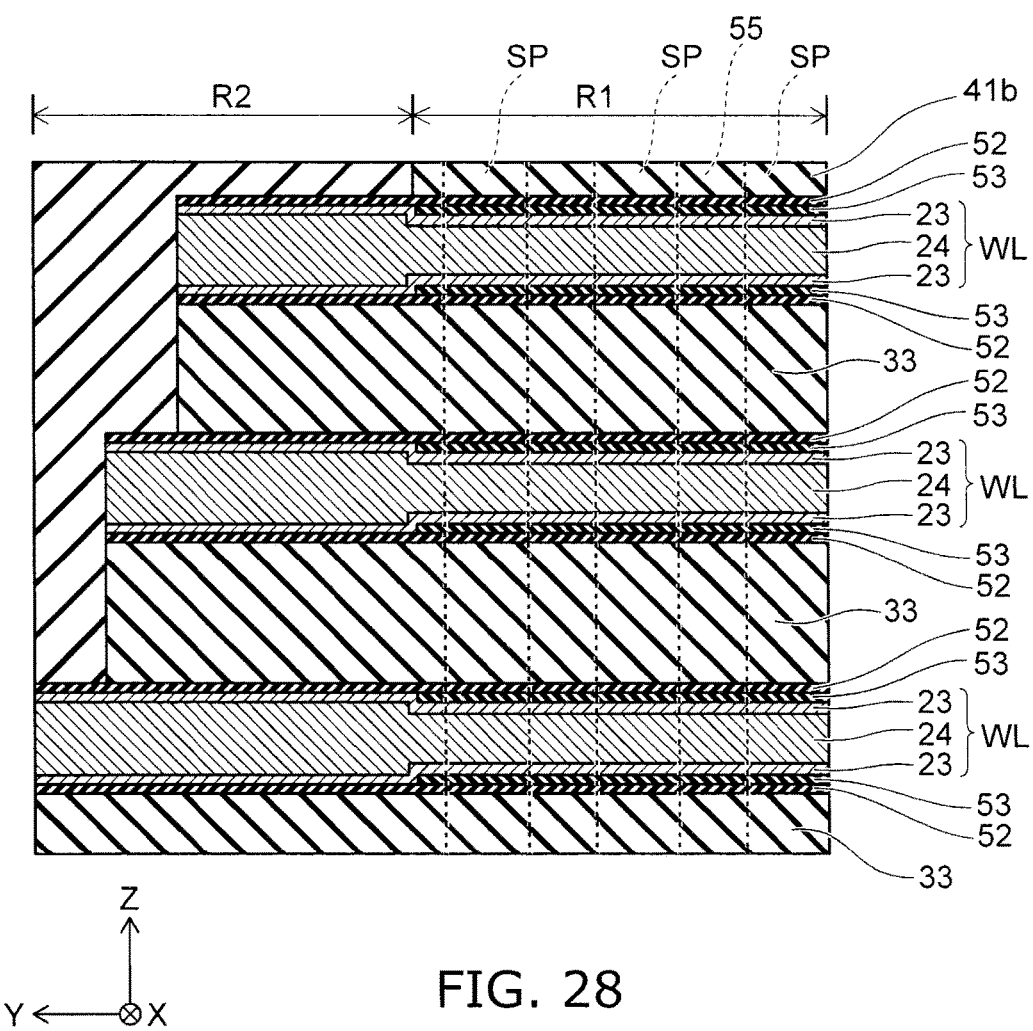
FIG. 28 is a sectional view illustrating the method for manufacturing the semiconductor memory device according to the embodiment.

As shown in FIGS. 27 and 28, for example, wet etching is performed using BHF (Buffered Hydrogen Fluoride) or DHF (Diluted hydrofluoric acid) via the slits ST. At this point, the cover films 61 are exposed in the memory cell region R1. The block insulating films 52 are exposed in the contact region R2. The cover films 61 and the block insulating films 52 are formed of silicon oxide. Annealing is applied to the block insulating films 52 after the formation of the block insulating films 52. Annealing is not applied to the cover films 61 after the formation of the cover films 61. Therefore, an etching rate of the cover films 61 are, for example, twice to three times or more as high compared with an etching rate of the block insulating films 52. Depending on an etching time, the block insulating films 52 in the contact region R2 remain or all the block insulating films 52 are removed.

For example, titanium nitride is deposited to form the barrier metal films 23 on the surfaces of the block insulating films 53. In the formation of the barrier metal films 23, the barrier metal films 23 are formed to be substantially uniform in thickness without filling all the hollows 58. For example, tungsten is deposited to fill all the hollows 58 and form the conductive members 24 on the surfaces of the barrier metal films 23. The conductive members 24 and the barrier metal films 23 provided on the side surfaces of the slits ST are removed to expose the block insulating films 53. Consequently, the conductive members 24 and the barrier metal films 23 are divided into layers in the Z-direction and the word lines WL are formed. The insides of the slits ST are filled with an insulating material to form the insulating members 19.

As shown in FIGS. 1 and 4, above the end portion E in the Y-direction of the control gate electrode CG, RIE is applied to form contact holes 27h that pierce through the insulating film 36 in the Z-direction. For example, tungsten is deposited to form contacts 27 in the contact holes 27h. Like the formation of the contacts 27, contacts 37 and 38 are formed. The interconnects L3 separated in the X-direction and extending in the Y-direction are formed on the contacts 27. Like the formation of the interconnects L3, the interconnects L1 and L2 are formed.

An insulating material is deposited to form insulating films 71 on the masks 41b and the insulating film 36. Above the silicon pillars SPa, RIE is applied to form contact holes 28h that pierce through the masks 41b and the insulating films 71 in the Z-direction. For example, tungsten is deposited to form contacts 28 in the contact holes 28h. Bit lines BLa separated in the Y-direction and extending in the X-direction are formed on the contacts 28. Like the formation of the bit lines BLa, the contacts 28 and bit lines BLb are formed above the silicon pillars SPb.

Effects of the embodiment are described.

As shown in FIG. 4, in the semiconductor memory device 1 according to the embodiment, the block insulating films 52 are provided in contact with the word lines WL of the control gate electrodes CG in the contact region R2. The block insulating films 53 are not provided in the contact region R2. Therefore, the area on an XZ plane of the word lines WL of the control gate electrodes CG in the contact region R2 is larger because the block insulating films 53 are not provided. Consequently, the interconnect resistance of the control gate electrodes CG is low compared with when the block insulating films 53 are provided in the contact region R2.

In the drain-side selection gate electrodes SGD and the source-side selection gate electrodes SGS, as in the control gate electrodes CG, the block insulating films 53 are not provided. Therefore, the interconnect resistances of the drain-side selection gate electrodes SGD and the source-side selection gate electrodes SGS can be reduced.

As a result, it is possible to provide the semiconductor memory device in which the interconnect resistances of the control gate electrodes CG, the drain-side selection gate electrodes SGD, and the source-side selection gate electrodes SGS are reduced and the method for manufacturing the semiconductor memory device.

When the block insulating films 53 are formed of, for example, a High-k film of an oxide film containing hafnium, zirconium, or the like, it is deemed difficult to pierce the block insulating films 53 with RIE. In the embodiment, since the block insulating films 53 are not provided, compared with when the block insulating films 53 are provided, it is possible to easily process the contacts 28, the contacts 37, and the contacts 38.

According to the embodiment described above, it is possible to provide the semiconductor memory device in which interconnect resistance is reduced and the method for manufacturing the semiconductor memory device.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor memory device comprising:
a semiconductor pillar extending in a first direction in a first region;
a first electrode film provided on a second direction side of the semiconductor pillar and extending in a third direction in the first region and in a second region adjacent to the first region in the third direction, the second direction being different from the first direction, the third direction being different from the first direction and the second direction;
a second electrode film provided between the semiconductor pillar and the first electrode film in the first region;
a first insulating film provided between the semiconductor pillar and the second electrode film;
a second insulating film provided between the second electrode film and the first electrode film;
a third insulating film provided between the second insulating film and the first electrode film;
a fourth insulating film provided between the third insulating film and the first electrode film; and
a contact provided in the second region and connected to the first electrode film,
a film thickness in the first direction of the first electrode film in the first region being smaller than a film thickness in the first direction of the first electrode film in the second region.

2. A semiconductor memory device comprising:
a semiconductor pillar extending in a first direction in a first region;
a stacked body in which a first electrode film provided on a second direction side of the semiconductor pillar and extending in a third direction and an interlayer insulating film are alternately stacked in the first direction, the second direction being different from the first direction, the third direction being different from the first direction and the second direction;
a second electrode film provided between the semiconductor pillar and the first electrode film in the first region;
a first insulating film provided between the semiconductor pillar and the second electrode film;
a second insulating film provided between the second electrode film and the first electrode film;
a third insulating film provided between the second insulating film and the first electrode film;
a fourth insulating film provided between the third insulating film and the first electrode film; and
a contact provided in a second region adjacent to the first region and connected to the first electrode film,
the first electrode film and the interlayer insulating film being disposed not via the fourth insulating film in the second region.

3. The device according to claim 2, wherein, in an adjacent region of a contact connecting section, which is a connecting portion of the first electrode film and the contact, the first electrode film and the interlayer insulating film are disposed between the first electrode film and the interlayer insulating film not via the fourth insulating film.

4. The device according to claim 2, wherein the second region is a region including an end portion on the second direction side of the first electrode film.

5. The device according to claim 2, wherein
the second region includes end portions on the second direction side of a plurality of the first electrode films mutually distal in the first direction, and
positions in the second direction of the end portions are different from each other.

6. The device according to claim 2, wherein film thickness in the first direction of the first electrode film in the first region is smaller than film thickness in the first direction of the first electrode film in the second region.

7. The device according to claim 2, wherein
in the first region, the third insulating film and the fourth insulating film are provided between the first electrode film and the interlayer insulating film, and
in the second region, the fourth insulating film is not provided between the first electrode film and the interlayer insulating film.

8. The device according to claim 2, wherein, in the second region, the first electrode film and the interlayer insulating film are in direct contact with each other.

9. The device according to claim 2, wherein
the third insulating film extends in the second region, and
the third insulating film is disposed between the first electrode film and the interlayer insulating film as well.

10. The device according to claim 2, wherein the third insulating film includes a silicon oxide film.

11. The device according to claim 2, wherein the second insulating film is a silicon nitride film, an oxide film containing aluminum, hafnium, or zirconium, a mixed film of the silicon nitride film and the oxide film, or a film obtained by adding metal to the mixed film.

12. The device according to claim 2, wherein the fourth insulating film is a silicon nitride film, an oxide film containing aluminum, hafnium, or zirconium, or a mixed film of the silicon nitride film and the oxide film.

* * * * *